(12) United States Patent
Seo et al.

(10) Patent No.: US 11,868,647 B2
(45) Date of Patent: Jan. 9, 2024

(54) NONVOLATILE MEMORY DEVICE, WITH VALLEY SEARCH FOR THRESHOLD VOLTAGE, MEMORY CONTROLLER, AND READING METHOD OF STORAGE DEVICE INCLUDING THE SAME

(71) Applicant: SAMSUNG ELECTRONICS CO., LTD., Suwon-si (KR)

(72) Inventors: Youngdeok Seo, Seoul (KR); Jinyoung Kim, Seoul (KR); Sehwan Park, Yongin-si (KR); Ilhan Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 107 days.

(21) Appl. No.: 17/522,578

(22) Filed: Nov. 9, 2021

(65) Prior Publication Data
US 2022/0276802 A1    Sep. 1, 2022

(30) Foreign Application Priority Data
Feb. 26, 2021   (KR) .................. 10-2021-0026074

(51) Int. Cl.
G06F 3/06    (2006.01)
(52) U.S. Cl.
CPC .......... *G06F 3/0655* (2013.01); *G06F 3/0604* (2013.01); *G06F 3/0679* (2013.01)
(58) Field of Classification Search
CPC ..... G06F 3/0655; G06F 3/0679; G06F 3/0604
See application file for complete search history.

(56) References Cited

U.S. PATENT DOCUMENTS

| | | |
|---|---|---|
| 9,514,827 B1 | 12/2016 | Nam et al. |
| 10,090,046 B2 | 10/2018 | Park et al. |
| 10,607,708 B2 | 3/2020 | Oh et al. |
| 10,629,259 B2 | 4/2020 | Jang |
| 2012/0008414 A1* | 1/2012 | Katz .................. G11C 16/26 365/185.24 |
| 2012/0134213 A1* | 5/2012 | Choi .................. G11C 16/10 365/185.18 |

(Continued)

FOREIGN PATENT DOCUMENTS

| | | |
|---|---|---|
| KR | 1020140031556 A | 3/2014 |
| KR | 1020170004505 A | 1/2017 |

(Continued)

*Primary Examiner* — Mark A Giardino, Jr.
(74) *Attorney, Agent, or Firm* — Sughrue Mion, PLLC

(57) ABSTRACT

A nonvolatile memory device includes a memory block including a memory area, an on-chip valley search (OVS) circuit performing an OVS sensing operation on the memory block, and a buffer memory storing at least one variation table including variation information of a threshold voltage of memory cells, obtained from the OVS sensing operation. A reading operation including an OVS sensing operation and a main sensing operation on the memory area is performed in response to a read command applied by a memory controller, the OVS sensing operation is performed at an OVS sensing level, and the main sensing operation is performed at a main sensing level reflecting the variation information. In the nonvolatile memory device, correction accuracy for deterioration of a word line threshold voltage may be improved, and a burden on a memory controller may be reduced.

17 Claims, 22 Drawing Sheets

(56) References Cited

U.S. PATENT DOCUMENTS

| | | | |
|---|---|---|---|
| 2014/0068384 A1 | 3/2014 | Kwak et al. | |
| 2015/0043282 A1 | 2/2015 | Shin et al. | |
| 2016/0062656 A1* | 3/2016 | Ramaraju | G11C 16/10 |
| | | | 711/103 |
| 2017/0235633 A1 | 8/2017 | Park | |
| 2017/0358346 A1* | 12/2017 | Zhang | G11C 16/349 |
| 2020/0058359 A1 | 2/2020 | Lee et al. | |
| 2020/0098436 A1 | 3/2020 | Kim et al. | |
| 2020/0151539 A1 | 5/2020 | Oh et al. | |
| 2020/0152279 A1 | 5/2020 | Oh et al. | |
| 2020/0208963 A1 | 7/2020 | Kimura et al. | |
| 2020/0286545 A1 | 9/2020 | Yoon | |
| 2021/0027845 A1* | 1/2021 | Lu | G06F 3/0604 |
| 2022/0011973 A1* | 1/2022 | Kim | G11C 11/5671 |
| 2022/0246207 A1* | 8/2022 | Nowell | G11C 16/10 |

FOREIGN PATENT DOCUMENTS

| | | |
|---|---|---|
| KR | 1020170097267 A | 8/2017 |
| KR | 102065664 B1 | 1/2020 |
| KR | 1020200019385 A | 2/2020 |
| KR | 1020200055976 A | 5/2020 |
| KR | 1020200057827 A | 5/2020 |
| KR | 1020200081240 A | 7/2020 |

\* cited by examiner

| STATE | WL01~WL37 | WL38~WL89 | WL90~WL127 |
|---|---|---|---|
| R1 | −50 mV | −20 mV | −50 mV |
| R2 | −50 mV | −20 mV | −50 mV |
| R3 | −30 mV | −20 mV | −20 mV |
| R4 | −50 mV | −40 mV | −30 mV |
| R5 | −30 mV | −20 mV | −40 mV |
| R6 | −30 mV | −30 mV | −30 mV |
| R7 | −30 mV | −30 mV | −40 mV |

FIG. 11

| STATE | WL01~WL37 | WL38~WL89 | WL90~WL127 |
|---|---|---|---|
| R1 | −30 mV | 0 mV | −40 mV |
| R2 | −30 mV | −20 mV | −40 mV |
| R3 | −20 mV | −20 mV | −10 mV |
| R4 | −40 mV | −20 mV | −30 mV |
| R5 | −20 mV | −20 mV | −40 mV |
| R6 | −20 mV | −20 mV | −30 mV |
| R7 | −20 mV | −20 mV | −10 mV |

FIG. 12

| | | Case 1 | Case 2 | Case 3 | Case 4 | Case 5 |
|---|---|---|---|---|---|---|
| STATE | R1 | −40 mV | −20 mV | 0 mV | 30 mV | 40 mV |

FIG. 15A

| STATE | WL1~WL37 | WL38~WL89 | WL90~WL127 |
|---|---|---|---|
| R1 | −30 mV | 0 mV | −40 mV |

FIG. 15B

| STATE | WL1~WL37 | WL38~WL89 | WL90~WL127 |
|---|---|---|---|
| R1 | −50 mV | −20 mV | −50 mV |

FIG. 15C

| WL1 w/ Case 2 | Read | OVST | VT |
|---|---|---|---|
| Normal RD | 2 V | 0 | 0 |
| OVS Sensing | | −20 mV | −30 mV |
| Main Sensing | 1.95 V | | |

| WL2 w/ Case 2 | Read | VT |
|---|---|---|
| History RD | 1.98 V | −30 mV |
| Normal RD | 1.95 V | |

| WL1 w/ Case 1 | Read | OVST | VT |
|---|---|---|---|
| Normal RD | 2 V | 0 | 0 |
| OVS Sensing | | −40 mV | −50 mV |
| Main Sensing | 1.91 V | | |

| WL2 w/ Case 1 | Read | VT |
|---|---|---|
| History RD | 1.96 V | −50 mV |
| Normal RD | 1.91 V | |

NONVOLATILE MEMORY DEVICE, WITH VALLEY SEARCH FOR THRESHOLD VOLTAGE, MEMORY CONTROLLER, AND READING METHOD OF STORAGE DEVICE INCLUDING THE SAME

CROSS-REFERENCE TO RELATED APPLICATION(S)

This application claims priority under 35 U.S.C. 119(a) to Korean Patent Application No. 10-2021-0026074 filed on Feb. 26, 2021 in the Korean Intellectual Property Office, the entire disclosure of which is incorporated herein by reference for all purposes.

BACKGROUND

Embodiments of the present disclosure are related to a nonvolatile memory device, a memory controller, and a reading method of a storage device including the same.

In general, in a reading operation, a storage device generates an error correction code using an error correction code (ECC) circuit, and in a reading operation, the storage device corrects data errors by referring to the error correction code. However, there are cases in which the degree of deterioration of memory cells of the storage device is so severe that correction by the ECC circuit is impossible. In this case, a read retry operation using a sensing technique, different from a normal reading operation, is performed.

SUMMARY

Example embodiments provide a nonvolatile memory device and a storage device including the same, in which accuracy of compensation for deterioration may be improved using a nonvolatile memory device including a variation table including variation information according to deterioration of a word line threshold voltage.

According to an aspect of an example embodiment, there is provided a nonvolatile memory device including: a memory block including a first memory area connected to a first word line; and control logic, wherein the control logic includes: an on-chip valley search (OVS) circuit configured to perform an OVS sensing operation on the memory block; and a first buffer memory configured to store at least one variation table including variation information of a threshold voltage of memory cells connected to the first word line, obtained from the OVS sensing operation, wherein the control logic is configured to: perform a first reading operation in response to a first read command applied by a memory controller with respect to the first memory area, the first reading operation including a first OVS sensing operation performed at a first OVS sensing level and a first main sensing operation performed in response to the first read command, the first main sensing operation performed at a first main sensing level reflecting the variation information.

According to an aspect of an example embodiment, there is provided a memory controller including: a processor; control pins configured to provide control signals to at least one nonvolatile memory device including a first memory area connected to a first word line; an error correction circuit configured to correct data read from the at least one nonvolatile memory device based on the control signals; and a buffer memory configured to store a plurality of tables for compensating for a reading level of a reading operation of the at least one nonvolatile memory device, wherein the processor is configured to input a first read command for performing a first reading operation on the first memory area using at least one variation table stored in the at least one nonvolatile memory device.

According to an aspect of an example embodiment, there is provided a reading method of a storage device, including: performing, in at least one nonvolatile memory device, a first on-chip valley search (OVS) sensing operation on selected memory cells in response to a first read command received from a memory controller; extracting variation information of threshold voltages of the selected memory cells and deterioration information of a memory block including the selected memory cells; performing a first main sensing operation at a modified reading level based on the variation information and the deterioration information; and outputting a result of the first OVS sensing operation and data of the first main sensing operation to the memory controller, wherein the first OVS sensing operation and the first main sensing operation are defined as a first reading operation.

BRIEF DESCRIPTION OF DRAWINGS

The above and other aspects, features, and advantages of the present disclosure will be more clearly understood from the following detailed description of example embodiments, taken in conjunction with the accompanying drawings, in which:

FIGS. 11 and 12 are diagrams illustrating an OVS operation using a variation table stored in a nonvolatile memory device according to an example embodiment;

FIGS. 15A to 15C are diagrams illustrating a reading method of a storage device according to an example embodiment;

DETAILED DESCRIPTION

Hereinafter, example embodiments will be described in detail with reference to the accompanying drawings.

The distribution of the programmed threshold voltage may be modified by at least one cause, for example, retention, disturbance, temperature, noise, or the like. This variation of the threshold voltage distribution may cause an error (e.g., error correction is impossible) in a reading operation. The recovery code may refer to a method of recovering an error in data read in a reading operation. In general, the defense code may include a process of finding a distribution valley of the threshold voltage. An On-chip Valley Search (OVS) operation may be advantageous for finding such distribution valleys. Specific details of OVS operation may be described in U.S. Patent Application Publication Nos. 2020/0286545 and 2020/0098436, and U.S. Pat. Nos. 10,090,046, 10,607,708, and 10,629,259, which are incorporated herein by reference.

Figure 1:
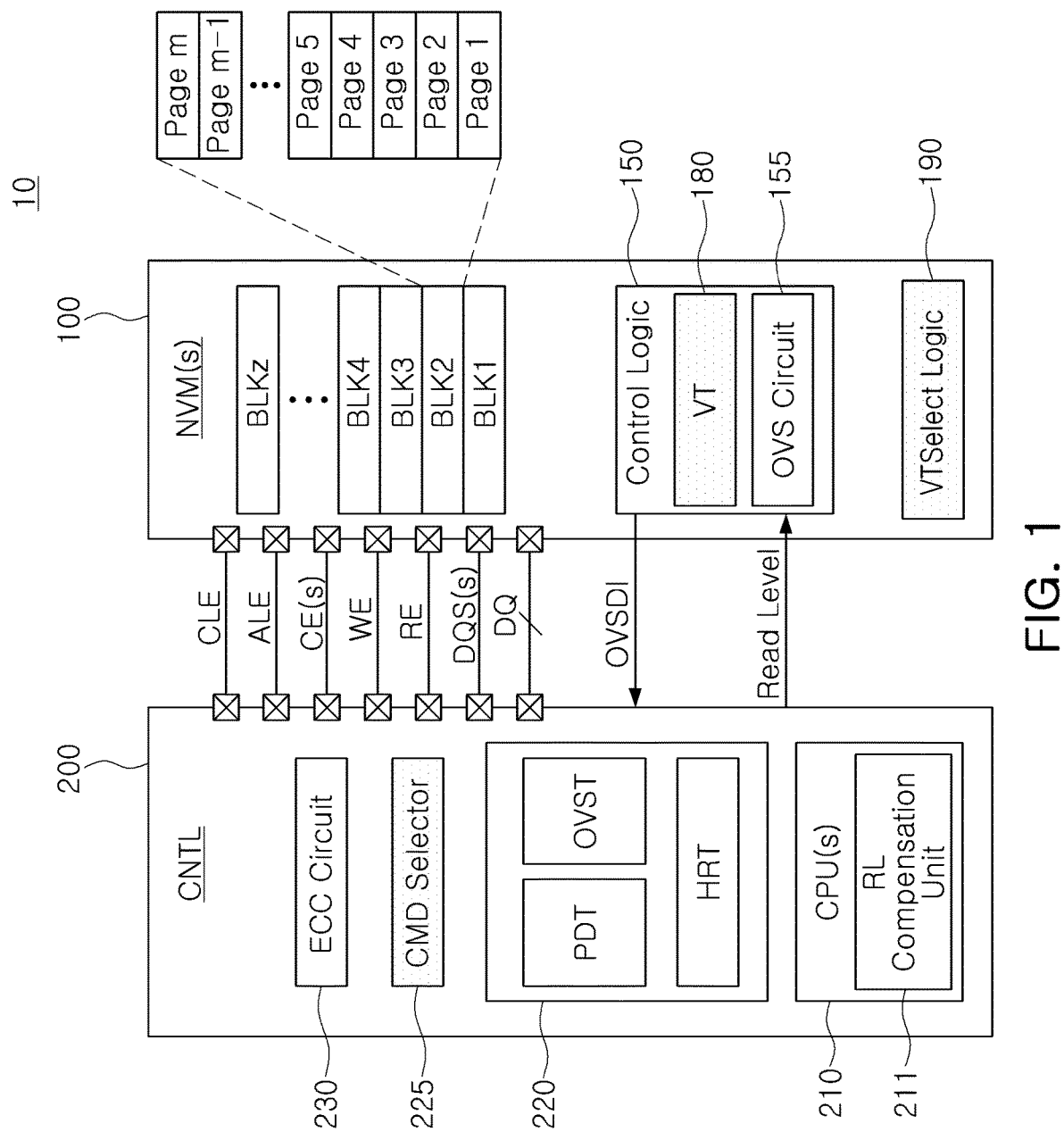
FIG. 1 is a schematic block diagram of a storage device according to an example embodiment.

FIG. 1 is a schematic block diagram of a storage device according to an example embodiment. Referring to FIG. 1, a storage device 10 may include at least one nonvolatile memory device 100 and a memory controller 200.

At least one nonvolatile memory device 100 may be implemented to store data. Examples of the nonvolatile memory device 100 may include a NAND flash memory, a vertical NAND flash memory (VNAND), a NOR flash memory, a resistive random access memory (RRAM), and a Phase-change memory (PRAM), a magnetoresistive random access memory (MRAM), a ferroelectric random access memory (FRAM), a spin transfer torque random access memory (STT-RAM), and on the like. Also, the nonvolatile memory device 100 may be implemented as a three-dimensional array structure. Embodiments may be applied not only to a flash memory device in which a charge storage layer is formed of a conductive floating gate, but also to a charge trap flash (CTF) memory in which a charge storage layer is formed of an insulating layer. Hereinafter, for convenience of description, a case in which the nonvolatile memory device 100 is a vertical NAND flash memory device is provided as an example.

The nonvolatile memory device 100 according to an example embodiment may be implemented to include a plurality of memory blocks BLK1 to BLKz, where z is an integer greater than or equal to 2, and a control logic 150. Each of the plurality of memory blocks BLK1 to BLKz may include a plurality of pages Page 1 to Page m, where m is an integer greater than or equal to 2. Each of the plurality of pages Page 1 to Page m may include a plurality of memory cells. Each of the plurality of memory cells may store at least one bit.

The control logic 150 may be implemented to receive a command and an address from the memory controller 200, and to perform an operation corresponding to the received command on memory cells corresponding to the address. For example, the operation may be any one of a programming operation, a reading operation, an erasing operation, and the like.

The control logic 150 may include an OVS circuit 155. The OVS circuit 155 may be implemented to perform an on-chip valley search (OVS) operation. In general, the OVS operation may include an operation of obtaining a cell count according to a plurality of development times, an operation of determining an OVS detection case based on the obtained cell count, an operation of changing an actual development time according to the determined OVS detection case, and an operation of reading by applying the changed development time.

In the nonvolatile memory device 100 according to an example embodiment of the present disclosure, the OVS operation may be expressed separately as an OVS sensing operation and a main sensing operation. For example, the nonvolatile memory device 100 according to an example embodiment obtains X/Y cell counts according to a plurality of development times by the OVS sensing operation, and may identify OVS detection cases based on the obtained X/Y cell counts. On the other hand, the nonvolatile memory device 100 may change an actual development time by a main sensing operation according to the determined OVS detection case. For example, the main sensing operation may be a reading operation.

The OVS circuit 155 may be implemented to store detection information OVSDI (detection case information) corresponding to the result of the OVS sensing operation. As an example, the detection information OVSDI may include information e.g., development time information, indicating an optimal distribution valley corresponding to the state.

In general, an optimal reading level for a reading operation may change according to deterioration of the nonvolatile memory device 100. For example, word lines included in the plurality of memory blocks BLK1 to BLKz that have undergone the same deterioration may have different optimal reading levels. Accordingly, when the reading operation is performed, if the same reading level is applied to each memory block, the reading operation may fail in a specific word line.

In the nonvolatile memory device 100 according to an example embodiment, the same reading level is not applied to all word lines included in the plurality of respective memory blocks BLK1 to BLKz, but an optimal reading level applied to another word line may be set based on a reading level set in a specific word line. Accordingly, a reading operation for all word lines may be stably performed without errors.

In the nonvolatile memory device 100 according to an example embodiment, the control logic 150 may further include a first buffer memory including at least one variation table 180. For example, the nonvolatile memory device 100 may perform a reading operation by considering variation information on threshold voltages of word lines included in the plurality of respective memory blocks BLK1 to BLKz by using at least one variation table 180. For example, the variation table 180 may include variation information of threshold voltages of word lines set by the OVS sensing operation. The threshold voltage variation information of the word lines included in each of the plurality of memory blocks BLK1 to BLKz may be generated based on changes in read voltages of a first memory area and a second memory area according to the deterioration of the nonvolatile memory device 100. For example, the first memory area and the second memory area may correspond to different pages among the plurality of pages Page 1 to Page m, respectively, and the first memory area and the second memory area may be connected to the first word line and the second word line, respectively.

On the other hand, the nonvolatile memory device 100 according to an example embodiment may further include a selection logic 190 for selecting at least one of the at least one variation table 180 based on the result of the OVS sensing operation. The selection logic 190 may select the variation table 180 for changing the reading level applied to the word line according to the degree of deterioration of the nonvolatile memory device 100. However it is merely an example, and the configuration is not limited thereto. For example, when the nonvolatile memory device 100 includes a first buffer memory including one variation table 180, the selection logic 190 may operate differently. Alternatively, in this case, the nonvolatile memory device 100 may not include the selection logic 190.

The memory controller 200 may be connected to the at least one nonvolatile memory device 100 by a plurality of control pins that transmit control signals e.g., CLE, ALE, CE(s), WE, RE, or the like. Also, the memory controller 200 may be implemented to control the nonvolatile memory device 100 using control signals. For example, the nonvolatile memory device 100 may perform a programming operation, a reading operation, and/or an erasing operation by latching a command CMD or an address ADD at an edge of a write enable (WE) signal according to a command latch enable (CLE) signal and an address latch enable (ALE) signal.

Also, the memory controller 200 may include at least one processor (Central Processing Unit (CPU(s)) 210, a second buffer memory 220, and an error correction circuit 230.

The processor 210 may be implemented to control the overall operation of the storage device 10. The processor 210 may perform various management operations such as cache/buffer management, firmware management, garbage collection management, wear leveling management, data deduplication management, read refresh/reclaim management, bad block management, multi-stream management, management of mapping of host data and nonvolatile memory, quality of service (QoS) management, system resource allocation management, nonvolatile memory queue management, reading level management, erase/program management, hot/cold data management, power loss protection management, dynamic thermal management, initialization management, redundant array of independent disk (RAID) management, and the like.

In detail, the processor 210 may drive a reading level compensation unit 211 that manages the reading level. The reading level compensation unit 211 may reflect detection information corresponding to a result of performing the OVS sensing operation to a history reading level in real time. For example, the reading level compensation unit 211 may accumulate an offset corresponding to the detection information set in an OVS table (OVST), in a history read level table (HRT). As an example, the reading level compensation unit 211 may be implemented in firmware/software. On the other hand, the reading level compensation unit 211 illustrated in FIG. 1 is illustrated as operating inside of the memory controller 200, but the configuration is not limited thereto. For example, the reading level compensation unit may operate inside of the nonvolatile memory device 100.

The second buffer memory 220 may be implemented as a volatile memory (e.g., static random access memory (SRAM), dynamic RAM (DRAM), synchronous RAM (SDRAM), or the like), or a nonvolatile memory (e.g., flash memory, phase-change RAM (PRAM), magneto-resistive RAM (MRAM), resistive RAM (ReRAM), ferro-electric RAM (FRAM), or the like). The second buffer memory 220 may include at least one Pre Defined Table (PDT), OVST and HRT.

The PDT may include first reading level offset information. For example, the PDT may include first reading level offset information corresponding to a program elapsed time. For example, the first reading level offset information may be an offset determined in advance based on environment information. For example, the PDT may include first reading level offset information corresponding to various deterioration information, temperature, program/erase cycle, read cycle, open word line case, or the like, in addition to the program elapsed time.

The OVST may include second reading level offset information corresponding to the detection information OVSDI. In this case, the detection information OVSDI may be development time information corresponding to an optimal distribution valley. For example, the second reading level offset information may include reading level offset information corresponding to development time information at which the OVS sensing operation has been performed. Accordingly, the OVST may be a table obtained by converting the detection information OVSDI into the reading level offset information.

The HRT may include third reading level offset information related to a history reading operation. In an example embodiment, the third reading level offset information may include information obtained by accumulating the second reading level offset information. In another embodiment, the third reading level offset information may be determined using the first reading level offset information and the second reading level offset information. In this case, the third reading level offset information may include a reading level at which a history reading operation is performed.

However, in the storage device 10 according to an example embodiment, since the deterioration of a word line threshold voltage is corrected inside of the nonvolatile memory device 100, the reading level included in the third reading level offset information may not be an optimal reading level. Detailed descriptions of the history reading operation are found in U.S. Pat. Nos. 10,120,589 and 10,373,693, which are incorporated herein as background literature.

The error correction circuit 230 may be implemented to generate an error correction code (ECC) during a programming operation and recover data using the error correction code during a reading operation. For example, the error correction circuit 230 may generate the error correction code ECC for correcting a fail bit or an error bit of data received from the nonvolatile memory device 100. The error correction circuit 230 may form data to which a parity bit is added by performing error correction encoding of data provided to the nonvolatile memory device 100. For example, the parity bit may be stored in the nonvolatile memory device 100. Also, the error correction circuit 230 may perform error correction decoding on data output from the nonvolatile memory device 100. The error correction circuit 230 may correct an error using the parity bit. The error correction circuit 230 may use various coded modulations, e.g., low density parity check (LDPC) code, BCH code, turbo code, Reed-Solomon code, convolution code, recursive systematic code (RSC), trellis-coded modulation (TCM), block coded modulation (BCM), or the like, to correct errors.

On the other hand, when error correction is impossible in the error correction circuit 230, a read retry operation may be performed. As an example, the read retry operation may include an OVS sensing operation. As an example, the OVS sensing operation may reflect the PDT. However, embodiments are not limited thereto.

The memory controller 200 according to an example embodiment may further include a command selector 225. For example, the command selector 225 may select a command input to the nonvolatile memory device 100. For example, the command selector 225 may select and output a command, so as to consider the deterioration correction of the word line threshold voltage performed in the nonvolatile memory device 100 after the OVS sensing operation, during the next word line reading operation.

The storage device 10 according to an example embodiment may perform deterioration correction of the word line threshold voltage using at least one variation table included in the nonvolatile memory device 100. In this case, the deterioration correction of a word line threshold voltage may be performed based on the X/Y cell count obtained by the OVS sensing operation. Therefore, the correction accuracy for the difference in the degree of deterioration between word lines, which is increased as the number of stages of the word lines increases may be improved. Furthermore, a decrease in a reading window occurring when deterioration continues may be significantly reduced. In addition, the nonvolatile memory device 100 according to an example embodiment may store at least one variation table by utilizing a peripheral circuit area, thereby reducing the memory usage of the memory controller 200, and in addition, the nonvolatile memory device 100 may also be applied to SSDs that do not include DRAM, or mobile products.

Figure 2:
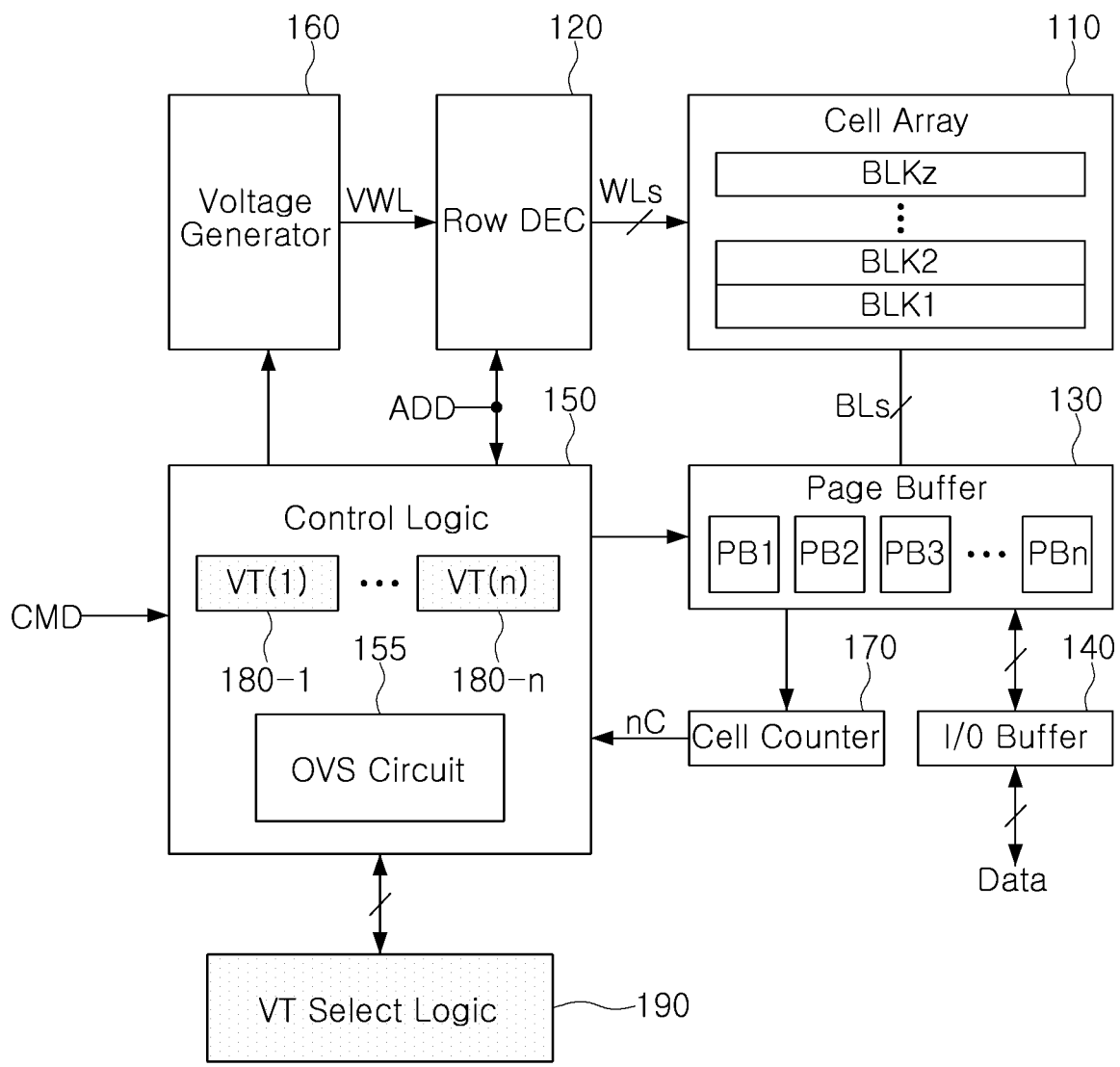
FIG. 2 is a schematic block diagram illustrating a nonvolatile memory device according to an example embodiment.

FIG. 2 is a schematic block diagram illustrating a nonvolatile memory device according to an example embodiment.

Referring to FIG. 2, the nonvolatile memory device 100 includes a memory cell array 110, a row decoder 120, a page buffer circuit 130, an input/output buffer circuit 140, a control logic 150, a voltage generator 160, and a cell counter 170.

The memory cell array 110 may be connected to the row decoder 120 through word lines WLs or select lines. The memory cell array 110 may be connected to the page buffer circuit 130 through bit lines BLs. The memory cell array 110 may include a plurality of cell strings. A channel of each of the cell strings may be formed in a vertical or horizontal direction. Each of the cell strings may include a plurality of memory cells. In this case, a programming operation, an erasing operation, or a reading operation may be performed on the plurality of memory cells by a voltage applied to the bit lines BLs or word lines WLs. In general, a programming operation may be performed in units of pages, and an erasing operation may be performed in units of blocks. Detailed descriptions of memory cells may be found in U.S. Pat. Nos. 7,679,133, 8,553,466, 8,654,587, 8,559,235, and 9,536,970. For example, the memory cell array 110 may include a two-dimensional memory cell array, and the two-dimensional memory cell array may include a plurality of NAND strings disposed in a row direction and a column direction.

The row decoder 120 may be implemented to select any one of the memory blocks BLK1 to BLKz of the memory cell array 110 in response to an address ADD. For example, the row decoder 120 may select any one of word lines of the selected memory block in response to the address ADD. The row decoder 120 may transfer a word line threshold voltage VWL corresponding to the operation mode to the word line of the selected memory block. During the programming operation, the row decoder 120 may apply a program voltage and a verify voltage to a selected word line and may apply a pass voltage to an unselected word line. During the reading operation, the row decoder 120 may apply a read voltage to a selected word line and may apply a read pass voltage to an unselected word line.

The page buffer circuit 130 may be implemented to operate as a write driver or a sense amplifier. During a programming operation, the page buffer circuit 130 may apply a bit line voltage corresponding to data to be programmed to the bit lines of the memory cell array 110. During a reading operation or a verify reading operation, the page buffer circuit 130 may detect data stored in the selected memory cell through the bit line BL. Each of the plurality of page buffers PB1 to PBn (n is an integer greater than or equal to 2) included in the page buffer circuit 130 may be connected to at least one bit line.

Each of the plurality of page buffers PB1 to PBn may be implemented to perform sensing and latching for performing an OVS operation. For example, each of the plurality of page buffers PB1 to PBn may perform a plurality of sensing operations to identify any one state stored in the selected memory cells under the control of the control logic 150. Also, after each of the plurality of page buffers PB1 to PBn may store data sensed by the plurality of sensing operations, and may select any one data under the control of the control logic 150. For example, each of the plurality of page buffers PB1 to PBn may perform sensing a plurality of times to identify any one state. In addition, each of the plurality of page buffers PB1 to PBn may select and/or output optimal data from among a plurality of sensed data according to the control of the control logic 150.

The input/output buffer circuit 140 may input an external signal to the nonvolatile memory device 100 or output a signal of the nonvolatile memory device 100 externally. For example, the input/output buffer circuit 140 may provide externally provided data to the page buffer circuit 130. For example, the input/output buffer circuit 140 may provide an externally provided command CMD to the control logic 150. For example, the input/output buffer circuit 140 may provide the externally provided address ADD to the control logic 150 or the row decoder 120. For example, the input/output buffer circuit 140 may output data sensed and latched by the page buffer circuit 130 externally.

The control logic 150 may be implemented to control the row decoder 120 and the page buffer circuit 130 in response to the command CMD transmitted from an external source. Also, the control logic 150 may include an OVS circuit 155 to perform an OVS sensing operation.

The OVS circuit 155 may control the page buffer circuit 130 and the voltage generator 160, for the OVS sensing operation. The OVS circuit 155 may control the page buffer circuit 130 to perform a plurality of sensing operations to identify a specific state of the selected memory cells. In addition, the OVS circuit 155 may control the plurality of page buffers PB1 to PBn to store sensing data corresponding to each of the plurality of sensing results in a plurality of latch sets provided in the plurality of page buffers PB1 to PBn, respectively. Also, the OVS circuit 155 may perform processing to select optimal data from among a plurality of sensed data. For selection of optimal data, the OVS circuit 155 may refer to a count result nC provided from the cell counter 170. For example, the OVS circuit 155 may control the page buffer circuit 130 to select and output a read result that is closest to the distribution valley from among the plurality of sensing results.

Also, the OVS circuit 155 may store the detection information OVSDI based on the count result nC corresponding to the OVS sensing operation. The OVS circuit 155 may output the stored detection information OVSDI to the memory controller 200. For example, the detection information OVSDI may be output using UIB out or output in response to a special command, e.g., a get feature command, a status read command, or the like.

On the other hand, as described in FIG. 1, the control logic 150 of the nonvolatile memory device 100 according to an example embodiment may further include a first buffer memory including one or more variation tables 180-1, . . . , and 180-n. For example, each of the one or more variation tables —180-1, . . . , and 180-n may include information on deterioration of threshold voltages of the word lines WLs. For example, the threshold voltage deterioration information of the word lines WLs may have a predetermined relationship with the arrangement of the word lines. However, it is only an example embodiment, and the configuration is not limited thereto. For example, the first buffer memory may be included in the nonvolatile memory device 100, as a separate configuration rather than inside of the control logic 150.

The voltage generator 160 may be implemented to generate various types of word line threshold voltages VWL to be applied to respective word lines WLs, and a well voltage to be supplied to a bulk, e.g., a well region, in which memory cells are formed, under the control of the control logic 150. The word line threshold voltages VWL applied to the respective word lines WLs may include a program voltage, a pass voltage, a read voltage, a read pass voltage, and the like.

The cell counter 170 may be implemented to count memory cells corresponding to a specific threshold voltage range from data sensed by the page buffer circuit 130. For example, the cell counter 170 may count the number of memory cells having a threshold voltage in a specific threshold voltage range by processing data sensed in each of the plurality of page buffers PB1 to PBn. Therefore, in the OVS sensing operation using the cell counter 170, the exact location of the distribution valley may be sensed.

The nonvolatile memory device 100 according to an example embodiment may further include a selection logic 190 for selecting the variation table 180-1, . . . , 180-n. The selection logic 190 may select a variation table for setting an optimal read voltage from among the one or more variation tables —180-1, . . . , and 180-n under the control of the control logic 150.

In the nonvolatile memory device 100 according to an example embodiment, in a process of setting an optimal read voltage from the OVS sensing operation, at least one variation table 180-1, . . . , 180-n may be used, thereby securing reliability of correction for word line threshold voltage deterioration. In addition, the nonvolatile memory device 100 according to an example embodiment selectively uses at least one variation table 180-1, . . . , 180-n, and thus, overcompensation in a situation in which deterioration is not severe may be prevented, and correction for word line threshold voltage deterioration may be applied even to SSDs or mobile products that do not include DRAM by significantly reducing the memory usage of the memory controller.

Figure 3:
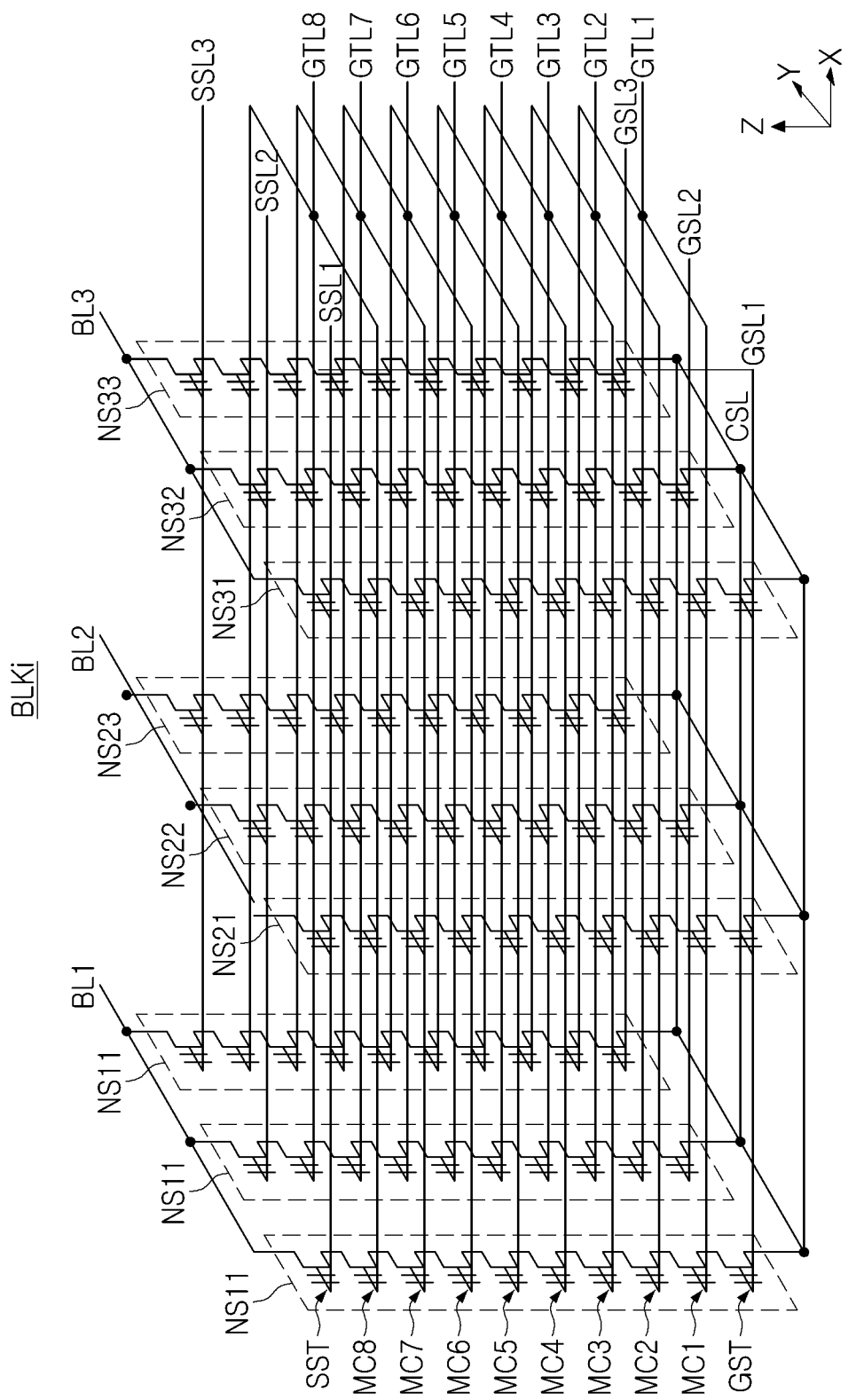
FIG. 3 is a circuit diagram of a memory block included in a nonvolatile memory device according to an example embodiment.

FIG. 3 is a circuit diagram of a memory block included in a nonvolatile memory device according to an example embodiment.

FIG. 3 is a circuit diagram of any one memory block BLKi among a plurality of memory blocks BLK1 to BLKz included in the nonvolatile memory device 100 illustrated in FIG. 2. For example, a plurality of memory NAND strings included in a memory block BLKi may be formed in a direction perpendicular to the substrate.

Referring to FIG. 3, the memory block BLKi may include a plurality of memory NAND strings NS11 to NS33 connected between the bit lines BL1, BL2, and BL3 and a common source line CSL. Each of the plurality of memory NAND strings NS11 to NS33 may include a string select transistor SST, a plurality of memory cells MC1, MC2, . . . , MC8, and a ground select transistor GST. Although it is illustrated in FIG. 3 that each of the plurality of memory NAND strings NS11 to NS33 includes eight memory cells MC1, MC2, . . . , MC8, embodiments are not limited thereto.

The string select transistor SST may be connected to the corresponding string select lines SSL1, SSL2, and SSL3. The plurality of memory cells MC1, MC2, . . . , and MC8 may be connected to corresponding gate lines GTL1, GTL2, . . . , and GTL8, respectively. The gate lines GTL1, GTL2, . . . , and GTL8 may correspond to word lines, and a portion of the gate lines GTL1, GTL2, . . . , and GTL8 may correspond to a dummy word line. The ground select transistor GST may be connected to the corresponding ground select lines GSL1, GSL2, and GSL3. The string select transistor SST may be connected to the corresponding bit lines BL1, BL2, and BL3, and the ground select transistor GST may be connected to the common source line CSL.

The word lines, e.g., GTL1 (which may also be referred to as WL1 herein) having the same height may be commonly connected, and the ground select lines GSL1, GSL2, and GSL3 and the string select lines SSL1, SSL2, and SSL3 may be separated from each other. FIG. 3 illustrates that the memory block BLK may be connected to eight gate lines GTL1, GTL2, . . . , and GTL8 and three bit lines BL1, BL2, and BL3, but the configuration is not limited thereto.

Figure 4:
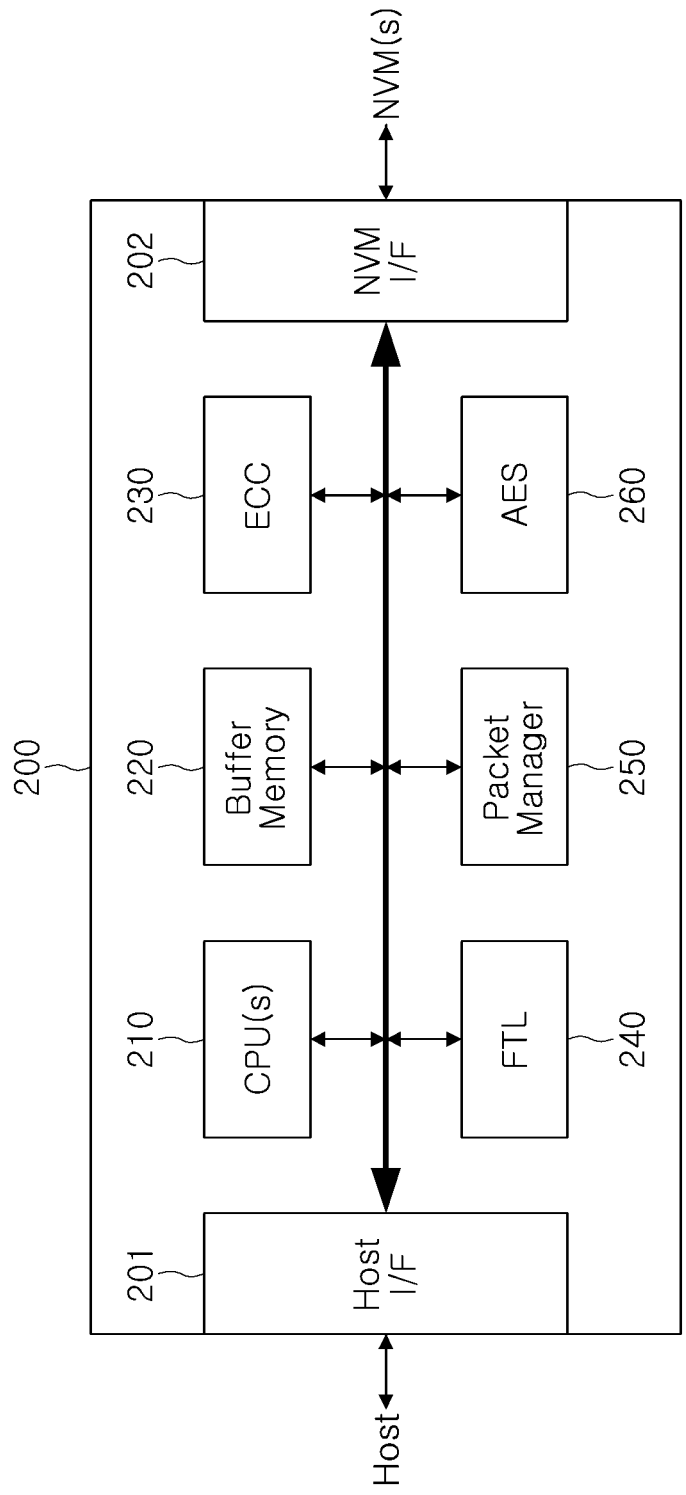
FIG. 4 is a schematic block diagram illustrating a memory controller according to an example embodiment.

FIG. 4 is a schematic block diagram illustrating a memory controller according to an example embodiment.

Referring to FIG. 4, the memory controller 200 may include a host interface 201, a memory interface 202, at least one CPU 210, a buffer memory 220, an error correction circuit 230, and a flash translation layer manager 240, a packet manager 250, and an encryption device 260. For example, the CPU 210, the buffer memory 220, and the error correction circuit 230 illustrated in FIG. 4 may correspond to the configurations illustrated in FIG. 1, respectively.

The host interface 201 may be implemented to transmit and receive packets to and from the host. A packet transmitted from the host to the host interface 201 may include a command, or data to be written to the nonvolatile memory device 100. A packet transmitted from the host interface 201 to the host may include a response to a command, or data read from the nonvolatile memory device 100. The memory interface 202 may transmit data to be written to the nonvolatile memory device 100 to the nonvolatile memory device 100 or receive data read from the nonvolatile memory device 100. This memory interface 202 may be implemented to comply with a standard protocol such as JDEC Toggle or ONFI.

The flash translation layer manager 240 may perform various functions such as address mapping, wear-leveling, and garbage collection. The address mapping operation may be an operation of changing a logical address received from the host into a physical address used to actually store data in the nonvolatile memory device 100. The wear-leveling is a technique for preventing excessive degradation of a specific block by ensuring that blocks in the nonvolatile memory device 100 are used uniformly, and for example, may be implemented through a firmware technology that balances erase counts of physical blocks. The garbage collection may be a technique for securing usable capacity in the nonvolatile memory device 100 by copying valid data of a block to a new block and then erasing an existing block.

The packet manager 250 may generate a packet according to a protocol of an interface negotiated with the host or parse various types of information from a packet received from the host. Also, the buffer memory 220 may temporarily store data to be written to the nonvolatile memory device 100 or data read from the nonvolatile memory device 100. For example, the buffer memory 220 may be a configuration provided in the memory controller 200. As another example, the buffer memory 220 may be disposed outside of the memory controller 200.

The encryption device 260 may perform at least one of an encryption operation and a decryption operation on data input to the memory controller 200, using a symmetric-key algorithm. The encryption device 260 may perform encryption and decryption of data using an advanced encryption standard (AES) algorithm. The encryption device 260 may include an encryption module and a decryption module.

Figure 5:
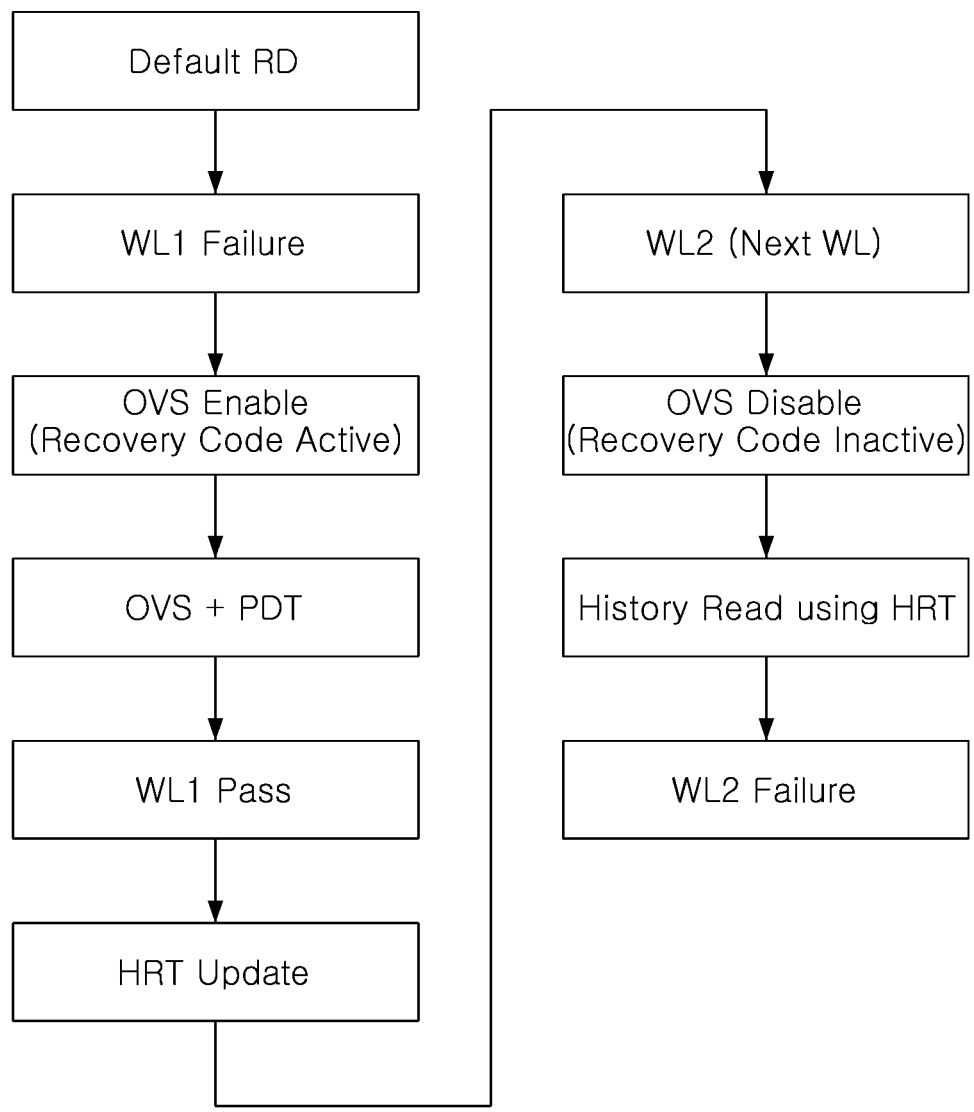
FIG. 5 is a flowchart illustrating a process of performing a reading operation using an OVS in a general storage device.

FIG. 5 is a flowchart illustrating a process of performing a reading operation using an OVS in a general storage device.

Referring to FIG. 5, a case in which a general storage device performs a reading operation on memory cells connected to the first word line WL1 using a default reading level may be provided as an example. For example, the default reading level may be a predetermined reference read voltage. When the reading operation fails, the OVS sensing operation for the memory cells connected to the first word line WL1 may be activated. For example, the nonvolatile memory device may enter the defense code. The OVS sensing operation may be performed by reflecting a predefined Pre Defined Table (PDT). When the reading operation for memory cells connected to the first word line WL1 passes by the OVS sensing operation, a history read table (HRT) may be updated. In this case, offset information of the PDT used for the OVS sensing operation may be updated in the HRT.

Thereafter, when a reading operation is performed on the memory cells connected to the next word line, for example, a second word line WL2, the OVS sensing operation may be basically deactivated. For example, the reading operation may be performed on the memory cells connected to the second word line WL2 in a state in which the defense code is released. In this case, a history reading operation may be performed using the updated HRT. Since a general storage device does not reflect an optimal reading level offset found in the OVS sensing operation to the HRT, there is a high probability that the reading operation of the memory cells connected to the next word line will fail.

On the other hand, the storage device 10 according to an example embodiment may reflect detection information by the OVS sensing operation to the HRT. Thus, when the main sensing operation and the next reading operation are performed, an optimal reading level may be applied by reflecting a variation table VT including word line variation information stored in the nonvolatile memory device 100 together with the HRT.

Figure 6:
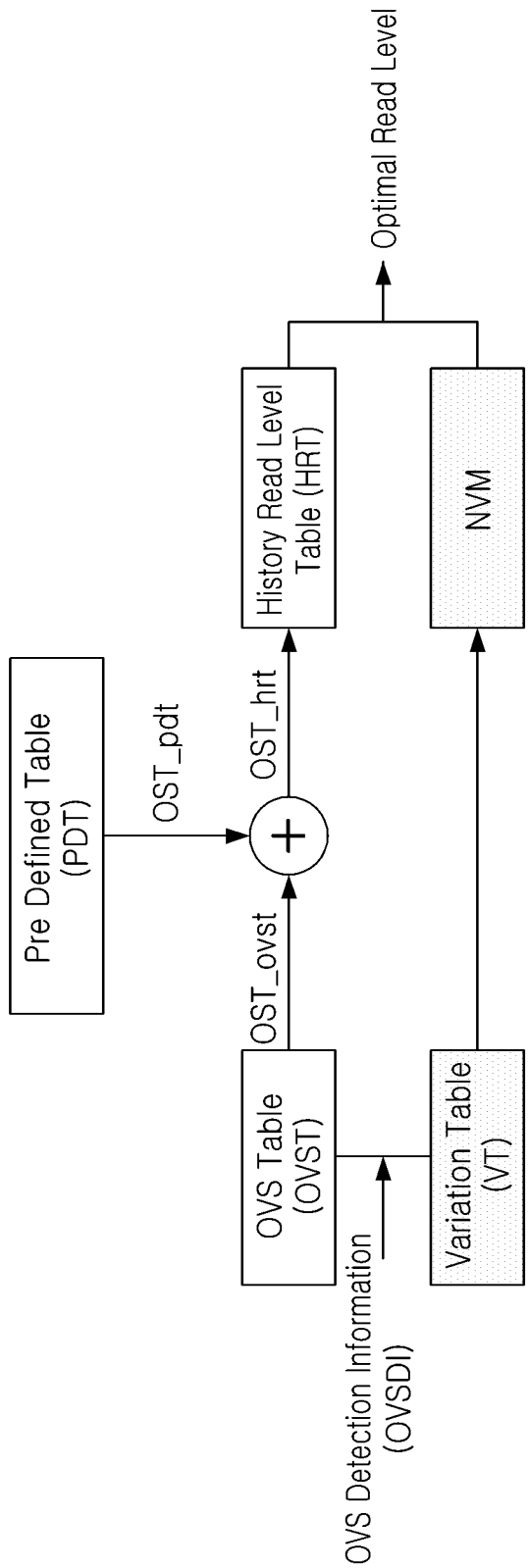
FIG. 6 is a diagram illustrating a process of extracting a reading level according to an OVS operation in a storage device according to an example embodiment.

FIG. 6 is a diagram illustrating a process of extracting a reading level according to an OVS operation in a storage device according to an example embodiment.

Referring to FIG. 6, the storage device 10 may update a third table HRT in real time using a first table PDT or a second table OVST, and may reflect the variation table VT stored in the nonvolatile memory device NVM together, thereby extracting an optimal reading level. The optimal reading level is applied within the NVM to read memory cells.

The result information according to the OVS sensing operation may include variation information of word line threshold voltage and other deterioration information. As an example, the detection information OVSDI may include a result according to the OVS operation, and the second reading level offset OST_ovst corresponding to deterioration information excluding the variation information of the word line threshold voltage may be reflected in the OVST in real time. On the other hand, in the storage device 10 according to an example embodiment, variation information of the word line threshold voltage included in the nonvolatile memory device 100 may not be output to the memory controller 200. For example, the variation information of the word line threshold voltage may be included in the variation table VT included in the nonvolatile memory device 100, and the variation table VT may be selectively updated according to an example embodiment.

On the other hand, a third reading level offset OST_hrt may be determined by accumulating a second reading level offset OST_ovst. Alternatively, the third reading level offset OST_hrt may be determined by adding the second reading level offset OST_ovst to the first reading level offset OSTpdt that is according to the lapse of the program time. On the other hand, the third reading level offset OST_hrt may not be determined only by simple addition of the first reading level offset OSTpdt or the second reading level offset OST_ovst. For example, the third reading level offset OST_hrt may be added by applying a weight to each of the first and second reading level offsets OSTpdt and OST_ovst.

Figure 7:
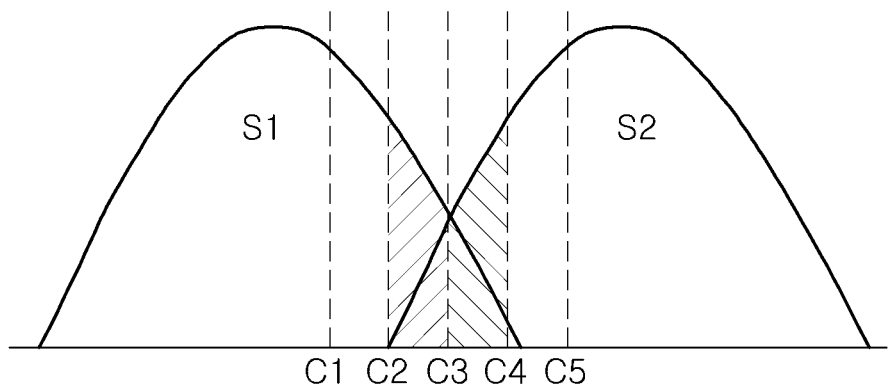
FIGS. 7 and 8 are diagrams illustrating different reading levels of a distribution valley and corresponding development times in an OVS operation of a general storage device.
Figure 8:
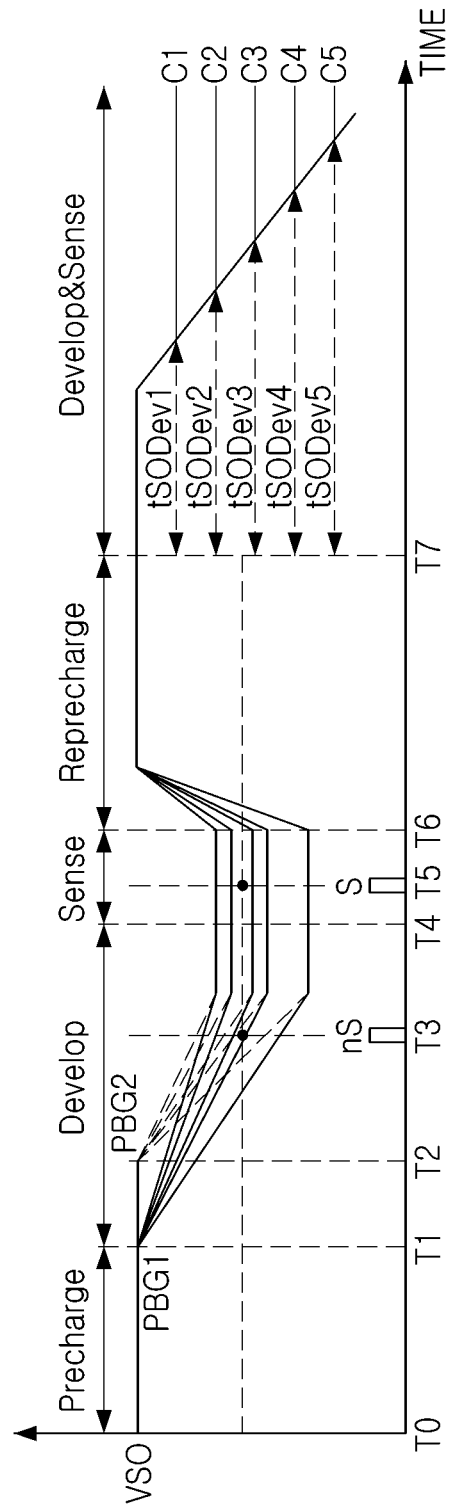

FIGS. 7 and 8 are diagrams illustrating different reading levels of a distribution valley and corresponding development times in an OVS operation of a general storage device.

As illustrated in FIG. 7, the OVS operation for finding the distribution valleys of states S1 and S2 may be performed by a plurality of sensing operations. In this case, the plurality of sensing operations may be simultaneously performed in the plurality of respective page buffer groups.

Referring to FIG. 8, in first page buffers PGB1 and the second page buffers PGB2, the OVS sensing operation may be performed in such a manner that a sensing node is sequentially latched at the same time points during different development periods to store the sensing result.

A precharge operation may be performed from time T0 to time T1. For precharging, a first bit line and a first sensing node connected to each of the first page buffers PBG1 may be charged. When bit line set-up signals are activated, the sensing node and the first bit line may be precharged to a specific level. When the first bit line set-up signal is inactivated to a high level at a time T1, a precharge circuit of each of the first page buffers PBG1 may be turned off. Also, when a second bit line set-up signal is inactivated to a high level at a time T2 after the time T1, a precharge circuit of each of the second page buffers PBG2 may be turned off. At this time, the level of each sensing node of the first page buffers PBG1 and the level of each sensing node of the second page buffers PBG2 may vary depending on a magnitude of current flowing to the corresponding bit line according to whether the memory cell is turned on or off.

As illustrated in FIG. 8, each of the first page buffers PBG1 may precharge the sensing node from time T0 to time T1, and may develop the first bit lines from time T1 to time T4. On the other hand, each of the second page buffers PBG2 may precharge the sensing node from time T0 to time T1, and may develop the second bit lines from time T2 to time T4, which are later than the time T1.

The first sensing operation may include a latch reset (nS) sensing operation performed at a time T3 and a latch set (S) sensing operation at a time T5. First cell count information may be calculated using on-cell count values of the latch reset (nS) sensing operation and the latch set (S) sensing operation in the first page buffers PGB1. Also, second cell count information may be calculated using on-cell count values of the latch reset (nS) sensing operation and the latch set (S) sensing operation in the second page buffers PGB2. On the other hand, a detection case, any one of C1 to C5, corresponding to an optimal reading level corresponding to a distribution valley may be determined based on the first and second cell count information of the first sensing operation. In addition, development times tSODev1 to tSODev5 of the second sensing operation corresponding to the determined detection case may be determined.

Figure 9:
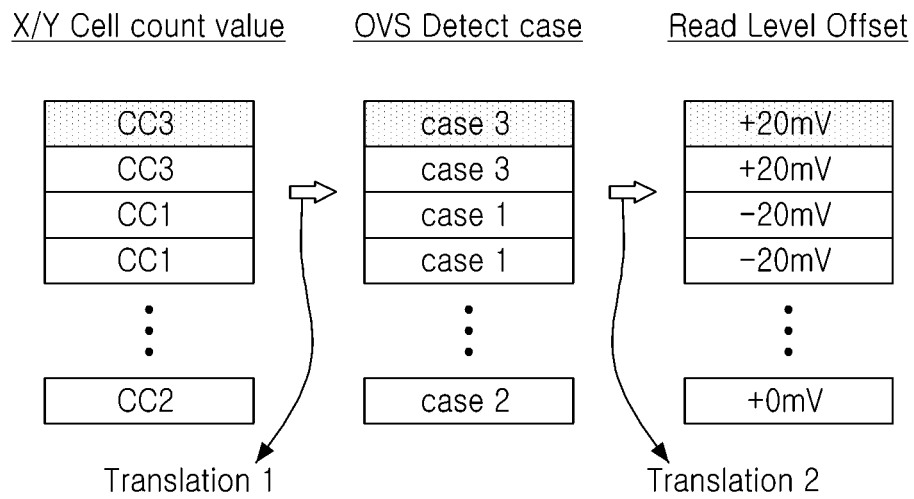
FIG. 9 is a diagram illustrating a process of correcting a reading level using an OVS table in a memory controller according to an example embodiment.

FIG. 9 is a diagram illustrating a process of correcting a reading level using an OVS table in a memory controller according to an example embodiment.

Referring to FIG. 9, an X/Y cell count value is determined according to the distribution of a threshold voltage according to an OVS sensing operation, and a first conversion of converting the determined X/Y cell count value into a detection case corresponding to a distribution valley may be performed. For example, in the case of an uppermost page, the cell count value may be CC3. In this case, the detection case of the OVS operation may correspond to a third detection case C3. The OVS circuit 155 (refer to FIG. 1) included in the nonvolatile memory device 100 (refer to FIG. 1) may store or latch data bits for each detection case.

Thereafter, the detection information OVSDI (refer to FIG. 1) may be output from the nonvolatile memory device 100 to the memory controller 200 (refer to FIG. 1). The memory controller 200 may generate a corresponding reading level offset (+20 mV) in the OVST, using the detection information, for example, the OVS detection case C3. For example, the variation information of the word line threshold voltage may be stored at the variation table, and may not be output to memory controller. Therefore, the generated reading level offset (+20 mV) may correspond to pieces of deterioration information except for variation information of the word line threshold voltage. In this case, the memory controller 200 may perform a second conversion operation on the reading level offset corresponding to the OVS detection case by using the OVST. Accordingly, the memory controller 200 may finally update the offset according to the OVS sensing operation to the HRT.

Figure 10A:
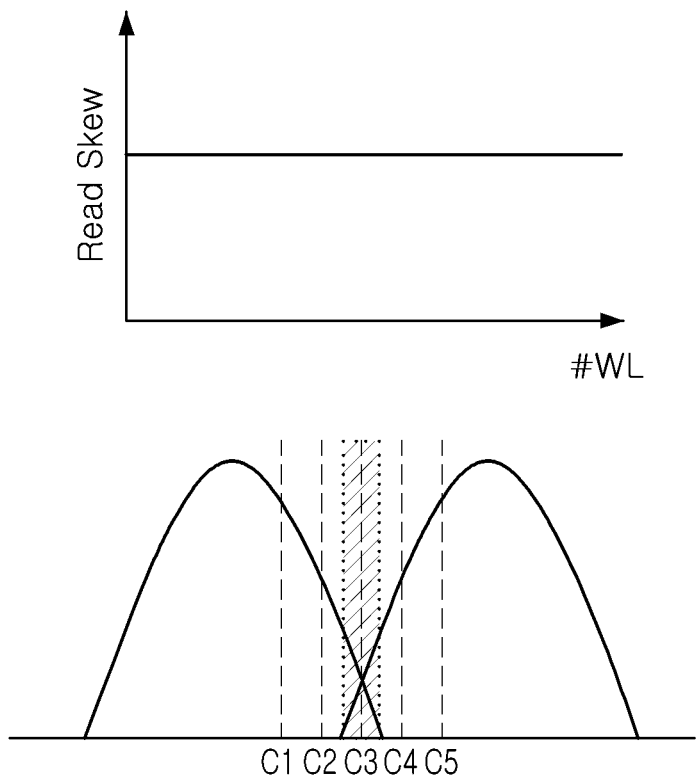
FIGS. 10A to 10C are diagrams illustrating an OVS operation according to a degree of deterioration of a word line threshold voltage in a nonvolatile memory device according to an example embodiment.
Figure 10B:
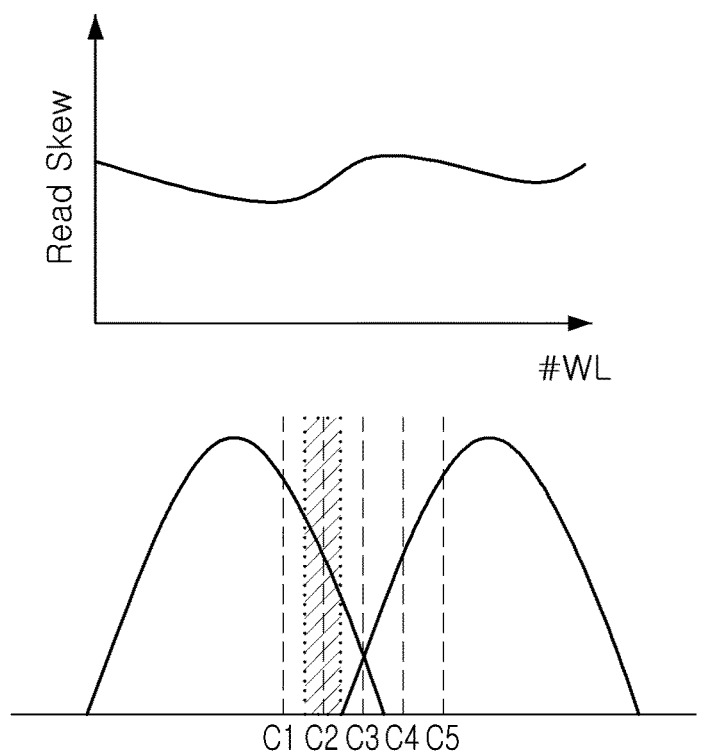
Figure 10C:
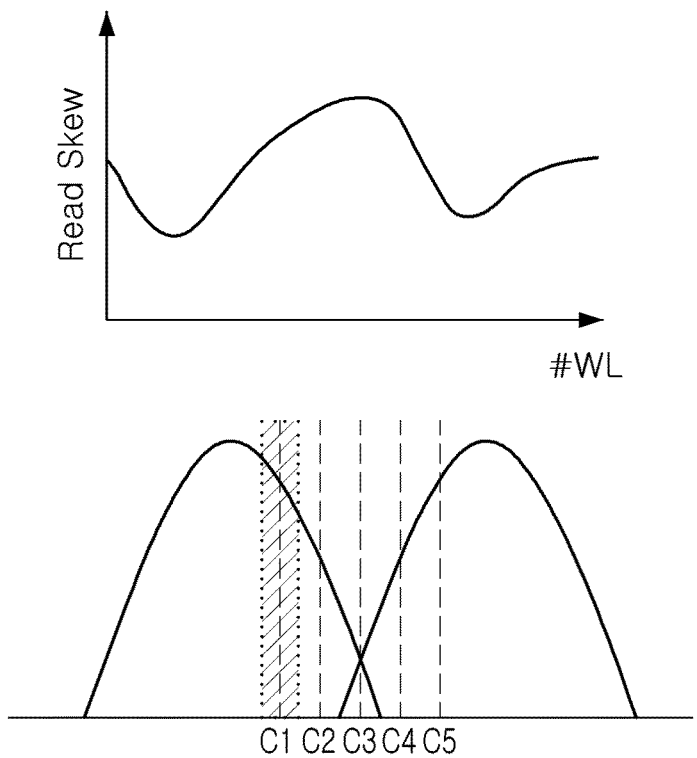

FIGS. 10A to 10C are diagrams illustrating an OVS operation according to a degree of deterioration of a word line threshold voltage in a nonvolatile memory device according to an example embodiment.

FIGS. 10A to 10C are diagrams illustrating a relationship between a result of an OVS sensing operation and an OVS detection case in the nonvolatile memory device 100 according to an example embodiment. As an example, a detection case may be derived using the first and second cell count values obtained by the OVS sensing operation. Also, the degree of deterioration of the word line threshold voltage may be known. On the other hand, FIGS. 10A to 10C may illustrating a read skew of a plurality of the word line. For example, as a level of the deterioration of word line threshold voltage increased, the variation of the read skew may increase. A tendency of deterioration of the word line threshold voltage determined based on the variation information of the word line threshold voltage may be similar to that of the word line threshold voltage determined based on the other pieces of deterioration information, but the configuration is not limited thereto. Although five OVS detection cases are illustrated in FIGS. 10A to 10C, this is only an example.

Referring to FIG. 10A, the detection case derived by the OVS sensing operation may be a third detection case. For example, the third detection case may be a case in which deterioration of the word line threshold voltage hardly progresses.

Referring to FIG. 10B, the detection case derived by the OVS sensing operation may be a second detection case. For example, the second detection case or a fourth detection case may be a case in which the threshold voltage has deteriorated to a certain extent. Accordingly, a change in the reading level for the reading operation may be required.

Referring to FIG. 10C, the detection case derived by the OVS sensing operation may be a first detection case. For example, the first detection case and a fifth detection case may be edge cases, which may be a case in which the word line threshold voltage is in a detectable maximum deterioration state. On the other hand, the variation table including variation information of the word line threshold voltage may be generated according to the maximum deterioration state. However, this configuration is merely an example.

FIGS. 11 and 12 are diagrams illustrating an OVS operation using a variation table stored in a nonvolatile memory device according to an example embodiment.

As an example, FIG. 11 may be a variation table VT illustrating a reading level offset according to states and word lines, when the deterioration of the threshold voltage distribution is great, and FIG. 12 may be a variation table VT illustrating a reading level offset according to states and word lines, when the deterioration of the threshold voltage distribution is low. As an example, although variation tables are illustrated based on 127 word lines in FIGS. 11 and 12, this is only an example. For example, the number of word lines may be more or less, and the reading level offset may be set by being divided into narrower word line sections.

The nonvolatile memory device 100 according to an example embodiment may include at least one variation table. On the other hand, the nonvolatile memory device 100 may select a variation table to be applied to setting a read voltage from among one or more variation tables, based on a result of the OVS sensing operation. For example, the variation table including the variation information to be reflected may be selected by the selection logic 190 (refer to FIG. 1) included in the nonvolatile memory device 100. For example, the selection logic 190 may select the variation table illustrated in FIG. 11 when the degree of deterioration of the word line threshold voltage is significant as a result of the OVS sensing operation as illustrated in FIG. 10C. On the other hand, when the deterioration degree of the word line threshold voltage is not severe as illustrated in FIG. 10B, the variation table illustrated in FIG. 12 may be selected. However, this is merely an example, and the configuration is not limited thereto. For example, the nonvolatile memory device 100 may include only one variation table.

On the other hand, the nonvolatile memory device 100 may set an optimal reading level for performing a reading operation by reflecting the variation information included in the variation table selected according to a detection case based on the OVS sensing operation. The variation information may be reflected in the reading level in various manners.

For example, as described above, a variation table including different pieces of variation information depending on a detection case may be selected and reflected in the reading level. On the other hand, a weight reflecting the variation information included in the variation table may be determined according to a detection case based on the OVS sensing operation. As an example, in the case in which the degree of deterioration of the word line threshold voltage is relatively significant as a result of the OVS sensing operation as illustrated in FIG. 10C, 100% of the variation information included in the variation table illustrated in FIG. 11 may be reflected when setting an optimal reading level. On the other hand, in the case in which the deterioration degree of the word line threshold voltage is not severe as illustrated in FIG. 10B, 50% of the variation information included in the variation table illustrated in FIG. 11 may be reflected. In detail, when the detection case is the edge case, the weight reflecting the variation information may be higher than when the detection case is not the edge case. However, this is only an example embodiment, and the weight applied to each detection case is not limited and may be variously changed.

Figure 13:
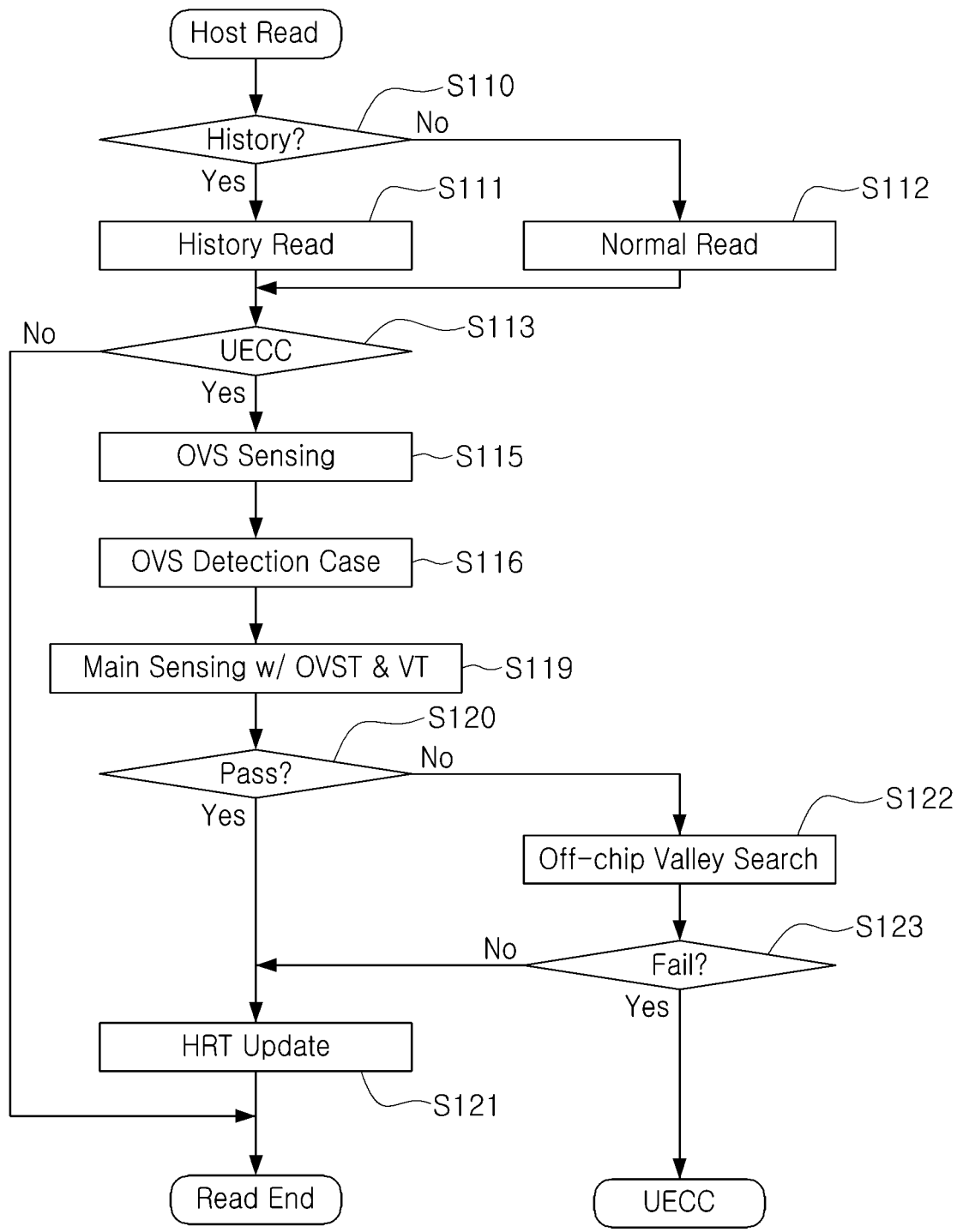
FIG. 13 is a flowchart illustrating a reading method of a storage device according to an example embodiment.

FIG. 13 is a flowchart illustrating a reading method of a storage device according to an example embodiment.

Referring to FIGS. 1 to 12 together, a reading operation of a storage device 10 according to an example embodiment may proceed as illustrated in FIG. 13. First, a read request may be received from a host (external) to the storage device 10. The storage device 10 may determine a history of such a read request. A history buffer may determine whether the currently received read request has been present previously (S110). For example, when a current read request is present among previous read requests stored in the history buffer, a history reading operation may be performed (S111). In this case, in the history reading operation, a reading operation may be performed with an optimal reading level included in a history reading level table HRT. On the other hand, in the case in which there is no current read request among previous read requests stored in the history buffer, a normal reading operation may be performed (S112). In this case, in the normal reading operation, a reading operation may be performed at a default reading level.

As a result of the history reading operation or the normal reading operation, it may be determined whether UECC occurs (S113). In this case, UECC may indicate that read data cannot be recovered by the ECC circuit 130 (refer to FIG. 1). In a case in which UECC does not occur, the reading operation may be immediately terminated.

On the other hand, when UECC occurs, it is possible to enter an OVS defense code. The OVS mode is basically activated, and the nonvolatile memory device 100 (refer to FIG. 1) may perform a read retry operation according to the activated OVS mode. In this case, the read retry operation may include an OVS sensing operation and a main sensing operation. In this case, the OVS sensing operation may include a process of detecting a cell count value by applying an OVS sensing level. For example, the OVS sensing level may be a default reading level (S115). On the other hand, by the OVS sensing operation, cell count values, threshold voltage variation information of the selected memory cells, and deterioration information of a memory block including the selected memory cells may be extracted. Accordingly, an OVS detection case according to deterioration may be determined even before the main sensing operation is performed (S116).

Thereafter, a main sensing level at which a main sensing operation is to be performed may be determined based on the result of the OVS sensing operation. For example, the main sensing level may be determined by reflecting the variation information of the variation table VT included in the nonvolatile memory device 100, in the OVS sensing level for performing the OVS sensing operation, together with information on a plurality of tables e.g., OVST, included in the memory controller 200. A main sensing operation may be performed on the selected memory cell according to the determined main sensing level (S119). In detail, the main sensing level for performing the main sensing operation may be a reading level having a different value from that of the OVS sensing level for performing the OVS sensing operation.

Thereafter, it may be determined whether the main sensing operation is a pass (S120). As a result of this determination, when the main sensing operation is a pass, the history reading level table HRT in which the offset information corresponding to the detection case has been reflected using the OVST may be updated (S121). However, this is merely an example. For example, the update conditions of the HRT may be different.

On the other hand, when the main sensing operation fails, an off-chip valley search operation may be performed for data recovery (S122). In this case, the off-chip valley search may mean finding a distribution valley by sequentially scanning a predetermined voltage section while increasing or decreasing by a predetermined voltage.

A reading operation may be performed according to the distribution valley according to the off-chip valley search operation, and it may be determined whether the result of the reading operation has failed (S123). For example, when there is no failure, the reading operation may be completed. When the result of the reading operation does not fail, the history reading level table HRT may be updated (S121). On the other hand, when the reading operation fails, UECC for a read request from the host may be finally generated. The generated UECC may be output to the host. However, this is merely an example. For example, in case of including the feature of the storage device 10 according to an example embodiment in which the OVS sensing operation and the main sensing operation are separately performed with different levels applied thereto, the operation may also be performed in a manner different from that illustrated in FIG. 13. As an example, conditions for performing the OVS sensing operation, or the like, may vary.

Figure 14:
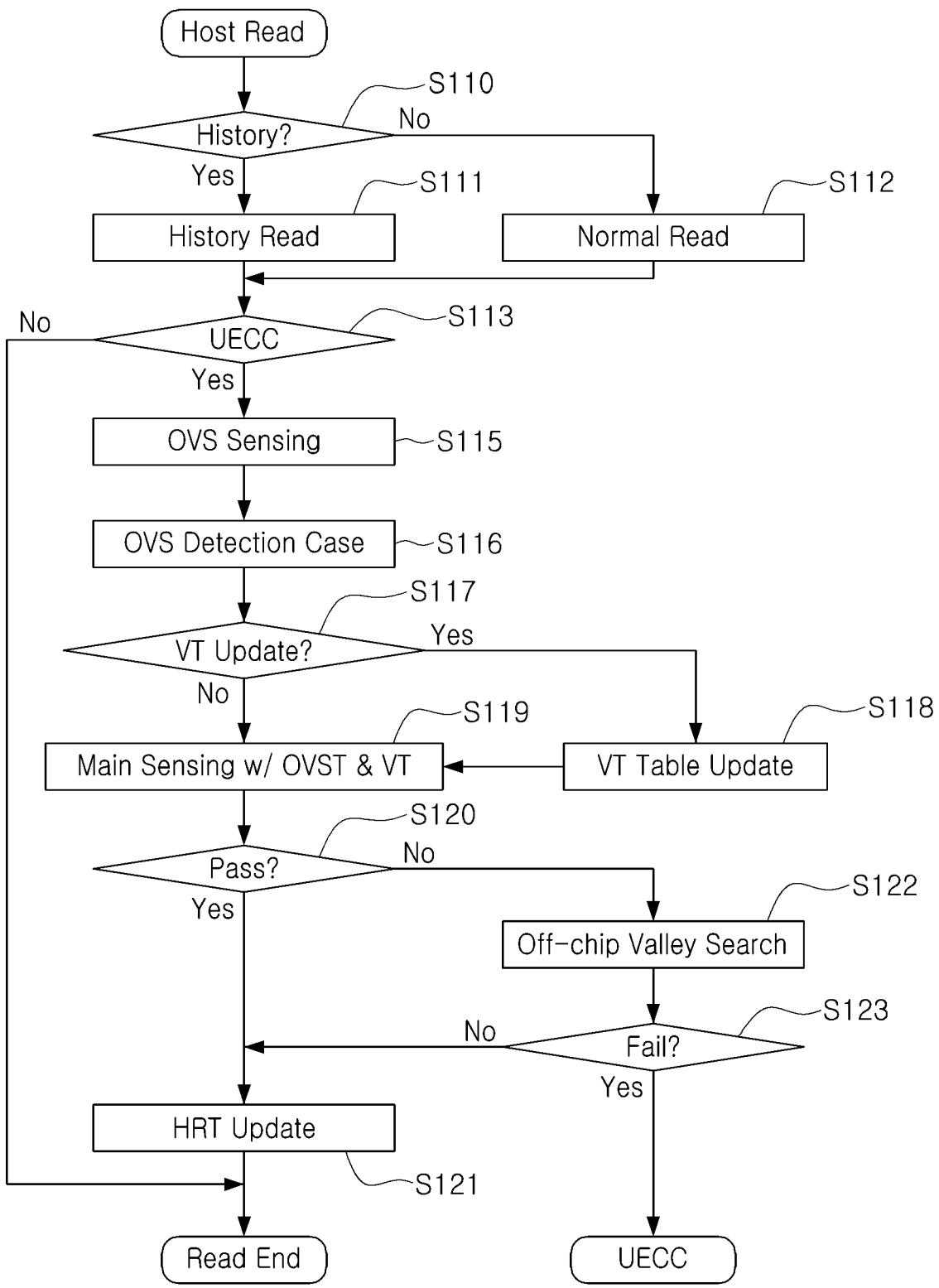
FIG. 14 is a flowchart illustrating a reading method of a storage device according to an example embodiment.

FIG. 14 is a flowchart illustrating a reading method of a storage device according to an example embodiment.

FIG. 14 is a diagram illustrating a modified embodiment of the reading method of the storage device illustrated in FIG. 13 according to an example embodiment. For example, operations S110 to S113, S115, S116, and S119 to S123 may correspond to the operations illustrated in FIG. 13. On the other hand, referring to FIG. 14, the storage device 10 according to an example embodiment extracts variation information of a word line threshold voltage as a result of an OVS sensing operation, and may determine whether or not to update the variation table VT by using the extracted variation information (S117). Accordingly, after selectively updating the variation table VT included in the nonvolatile memory device 100 based on the result of the OVS sensing operation (S118), the main sensing operation may be performed. On the other hand, the method of updating the variation table VT is not limited to any one, and the variation table VT may be updated in various methods.

FIGS. 15A to 15C are diagrams illustrating a reading method of a storage device according to an example embodiment.

FIGS. 15A to 15C may be diagrams illustrating reading level offsets for first to fifth detection cases in a first state R1. As an example, FIG. 15A may be an OVST including a block reading level offset for a memory block, and FIGS. 15B and 15C may be variation tables VT according to the degrees of deterioration of the word line threshold voltage. As an example, FIGS. 15B and 15C may correspond to portions of FIGS. 12 and 11, respectively.

Figures 16A, 16B, 16C:
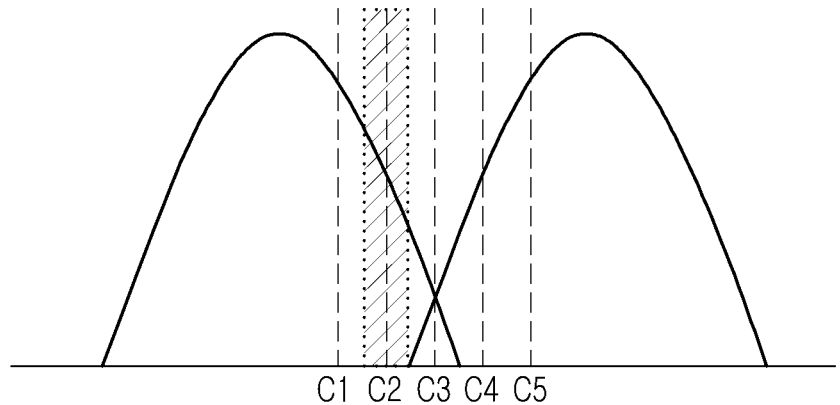
FIGS. 16A to 16C are diagrams illustrating a reading method of a storage device according to an example embodiment.

FIGS. 16A to 16C are diagrams illustrating a reading method of a storage device according to an example embodiment.

FIGS. 16A to 16C may be diagrams illustrating a reading method of the storage device 10 according to an example embodiment, when the OVS sensing operation result corresponds to the second detection case.

Referring to FIGS. 16A and 16B, a normal reading operation on the first word line WL1 may be performed at a default reading level of 2V. At this time, since the OVS is in an inactive state, the change in the reading level by OVST and VT may be 0. On the other hand, when UECC occurs in a normal reading operation, OVS may be activated and an OVS sensing operation may be performed, from which this case corresponding to the second detection case may be derived based on the cell count value obtained by the OVS sensing operation. Referring to FIGS. 15A and 15B together, in the second detection case, the deterioration information value of the OVST may be −20 mV, and the variation information value of the VT may be −30 mV. Accordingly, an optimal reading level calculated after the OVS sensing operation is performed may be 1.95V. Thereafter, a main sensing operation on the first word line WL1 may be performed with an optimal reading level.

Referring to FIG. 16C, after the read/retry operation on the first word line WL1 is finished, the reading operation on the second word line WL2 may be continuously performed. However, the second word line WL2 may be read by performing a history read without performing the OVS sensing operation again. However, since the variation table VT is included in the nonvolatile memory device 100 and cannot be reflected in the HRT, in the case in which the history read is performed only with the HRT, the reading operation may only be performed at 1.98V.

The storage device 10 according to an example embodiment may be configured to input a variation flag together with a second read command input to the nonvolatile memory device 100, to perform a reading operation on the second word line WL2. For example, a problem in which the variation table VT is not reflected in the HRT may be solved by using the variation flag, and a reading operation on the second word line WL2 may be performed at 1.95V. A description of the variation flag will be described later.

Figures 17A, 17B, 17C:
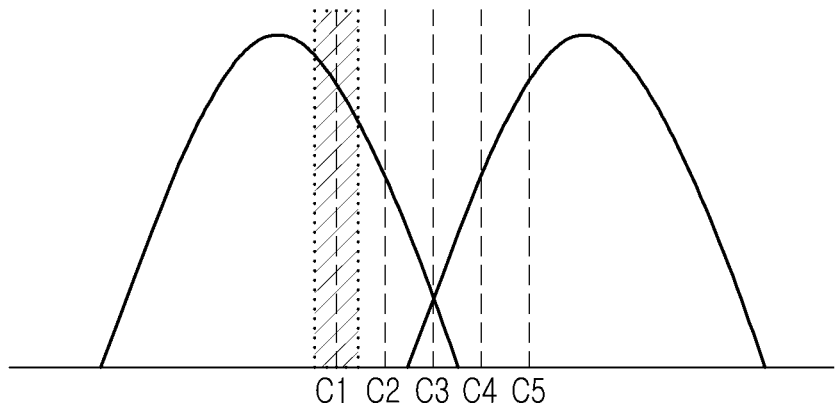
FIGS. 17A to 17C are diagrams illustrating a reading method of a storage device according to an example embodiment.

FIGS. 17A to 17C are diagrams illustrating a reading method of a storage device according to an example embodiment.

FIGS. 17A to 17C may be diagrams illustrating a reading method of the storage device 10 according to an example embodiment when the OVS sensing operation result corresponds to the first detection case. As an example, referring to FIGS. 15A and 15C together, in the first detection case, the deterioration information value of the OVST may be −40 mV, and the variation information value of the VT may be −50 mV. Other configurations may correspond to the description of FIGS. 16A to 16C.

Accordingly, an optimal reading level for performing a reading operation on the first word line WL1 and the second word line WL2 may be 1.91V. However, since a VT variation information value cannot be stored in the HRT of the memory controller 200, a reading operation on the second word line WL2 may be performed at 1.96V when only the HRT is reflected.

As described above, in the storage device 10 according to an example embodiment, a variation flag may be input together with the second read command that is input to the nonvolatile memory device 100, to perform a reading operation on the second word line WL2 by reflecting the variation information value of the VT.

Figure 18:
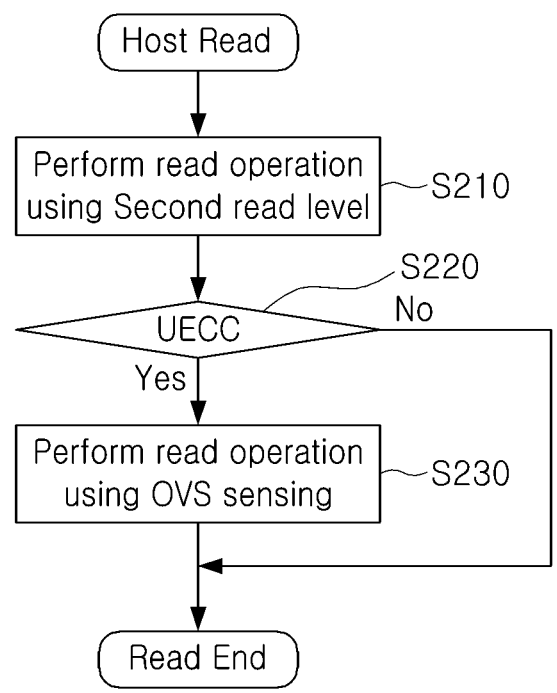
FIG. 18 is a flowchart illustrating a reading method of a storage device according to an example embodiment.

FIG. 18 is a flowchart illustrating a reading method of a storage device according to an example embodiment.

Referring to FIGS. 1 to 17 together, the reading operation of the storage device 10 according to an example embodiment may proceed as illustrated in FIG. 18. As an example, FIG. 18 may be a diagram illustrating a second reading operation on a second word line after the first reading operation on the first word line.

For example, in response to a second read command transmitted from the memory controller 200 (see FIG. 1), the nonvolatile memory device 100 (FIG. 1) may perform a reading operation using the second reading level (S210). On the other hand, the memory controller 200 may determine whether UECC is generated as a result of the second reading operation (S220). For example, in the case in which UECC has not occurred, the reading operation may be completed.

On the other hand, when UECC has occurred, another optimal reading level may be set by an OVS sensing operation in response to the OVS command transmitted from the memory controller 200, and the reading operation may be performed using the other set reading level (S230). In this case, information corresponding to the reading level may include variation information stored in a variation table and offset information of a history reading level table (HRT). On the other hand, the offset information of the HRT may be transmitted from the memory controller 200 together with the first read command.

Figure 19:
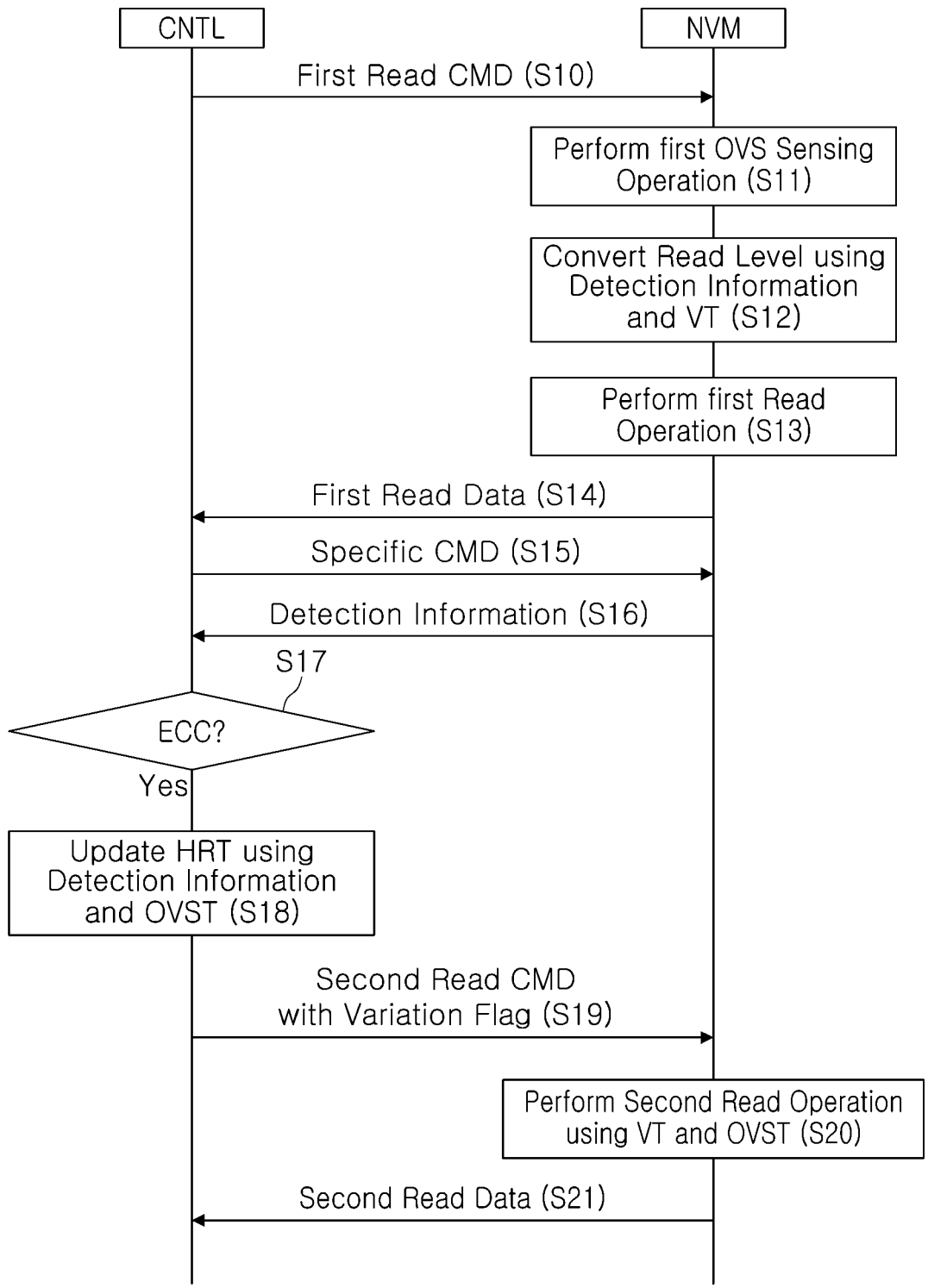
FIG. 19 is a ladder diagram illustrating a reading method of a storage device according to an example embodiment.

FIG. 19 is a ladder diagram illustrating a reading method of a storage device according to an example embodiment.

Referring to FIGS. 1 to 18 together, an OVS defense code process of a storage device 10 according to an example embodiment may proceed as illustrated in FIG. 19.

A memory controller CNTL may transmit a first read command to a nonvolatile memory device NVM according to an entry of an OVS defense code (S10). The nonvolatile memory device NVM may perform a first reading operation in response to the first read command. For example, the first reading operation may be an OVS reading operation, and the first reading operation may include a first OVS sensing operation and a first main sensing operation. The nonvolatile memory device NVM may perform the first OVS sensing operation at a default reading level (S11). The nonvolatile memory device NVM may obtain detection information by the first OVS sensing operation.

In the storage device 10 according to an example embodiment, the nonvolatile memory device NVM may change a default reading level to a reading level for performing a first main sensing operation using the obtained detection information and the variation table VT (S12). However, embodiments are not limited thereto, and the nonvolatile memory device NVM may change the reading level by using the OVST together. For example, the first main sensing operation may be performed at the first main sensing level (S13), and data read in the first main sensing operation may be output to the memory controller CNTL (S14).

Thereafter, the memory controller CNTL transmits a special command to the nonvolatile memory device NVM (S15), and the nonvolatile memory device NVM may output detection information corresponding to the detection case that is a result of the first OVS sensing operation to the memory controller CNTL in response to the special command (S16).

On the other hand, the memory controller CNTL may determine whether the read data cannot be error-corrected using an error correction circuit ECC (S17). For example, when the data read in the first reading operation is error-correctable (ECC), the HRT may be updated using the detected information and the OVST (S18). However, this is merely an example. For example, since the variation table VT is stored in the nonvolatile memory device NVM, the HRT may not include information of the variation table VT.

In the storage device 10 according to an example embodiment, the first reading operation may be an operation on the first memory area connected to the first word line. On the other hand, after the first reading operation is completed, a second reading operation may be performed on the second memory area connected to the second word line.

A second read command for performing a second reading operation on the second memory area may be input to the nonvolatile memory device NVM, based on the HRT stored in the memory controller CNTL. On the other hand, a variation flag for setting an optimal second reading level may be input together with the second read command (S19).

For example, the variation flag may include a signal that causes the nonvolatile memory device NVM to perform a second reading operation by reflecting variation information of the second word line threshold voltage. The signal may also be referred to as a value herein. Accordingly, the reading level based on the HRT that does not reflect the variation information of the second word line threshold voltage may be changed to an optimal second reading level by reflecting the variation table VT using the variation flag, and the second reading operation may be performed at the second reading level (S20). Thereafter, second read data and detection information read in the second reading operation may be transmitted to the memory controller CNTL (S21).

Figure 20:
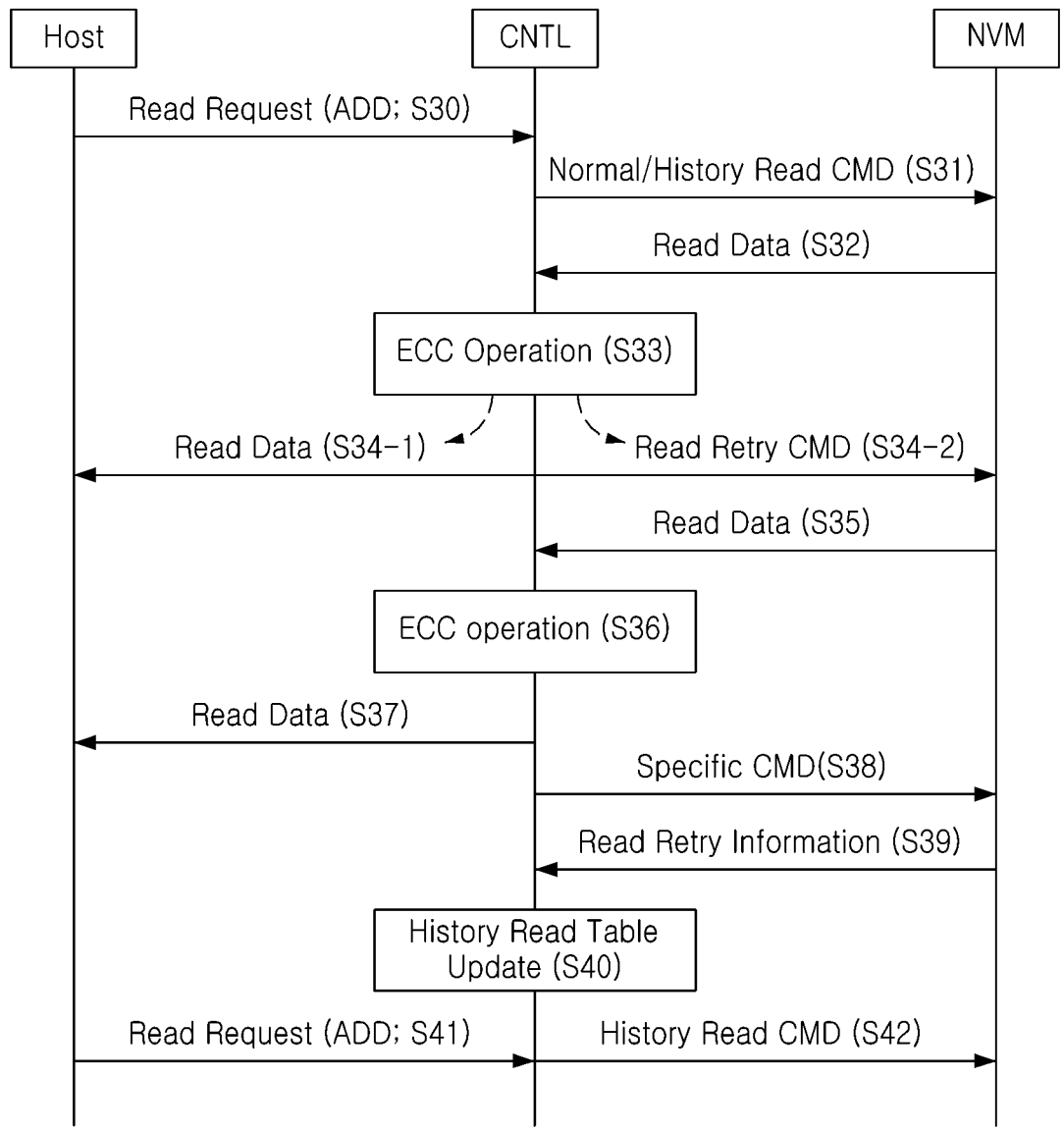
FIG. 20 is a ladder diagram illustrating a reading method of a storage device according to an example embodiment.

FIG. 20 is a ladder diagram illustrating a reading method of a storage device according to an example embodiment.

Referring to FIGS. 1 to 19 together, a reading operation of a storage device 10 according to an example embodiment may proceed as illustrated in FIG. 20.

For example, a host may transmit a read request to the storage device 10 together with an address ADD (S30). A memory controller 200 of the storage device 10 may receive the read request, search the history buffer, determine whether to perform a history reading operation or a normal reading operation, and transmit a normal/history read command corresponding to the determined operation to the nonvolatile memory device 100 (S31). The nonvolatile memory device 100 may perform a reading operation in response to the normal/history read command, and transmit read data obtained accordingly to the memory controller 200 (S32).

Thereafter, the memory controller 200 may perform an error correction operation on the data read by an error correction circuit 230 (S33). In the case in which there is no error or the error is correctable, read data or corrected data may be transmitted to the host (S34-1).

On the other hand, in the case in which error correction is not possible, the memory controller 200 may transmit a read retry command to the nonvolatile memory device 100 (S34-2). The nonvolatile memory device 100 may perform a reading operation using the OVS sensing in response to the read retry command, and may transmit the read data to the memory controller 200 (S35). For example, a series of processes S34-2 and S35 of performing the reading operation using OVS sensing may be described as described above with reference to FIGS. 1 to 19.

Thereafter, the memory controller 200 may again perform an error correction operation on the data read by the error correction circuit 230 (S36). For example, when there is no error or error is correctable, read data or corrected data may be transmitted to the host (S37). When the read retry operation is performed using the OVS sensing as in operations S34-2 to S35, the memory controller 200 may transmit a specific command to the nonvolatile memory device 100 to obtain the read retry information having reading level information (S38). The nonvolatile memory device 100 may output the read retry information in response to the specific command (S39). However, this is merely an example. For example, when a read retry operation is performed according to an off-chip valley search operation, operations S38 and S39 may be omitted.

On the other hand, the memory controller 200 may finally update the history reading level table HRT by using the read retry information (S40). Thereafter, when a read request for the address ADD of the memory area to which the same history reading level is applied is received from the host (S41), the storage device 100 may transmit a history read command using an optimal reading level reflected in the history reading level table HRT to the nonvolatile memory device 100 (S42).

Figure 21:
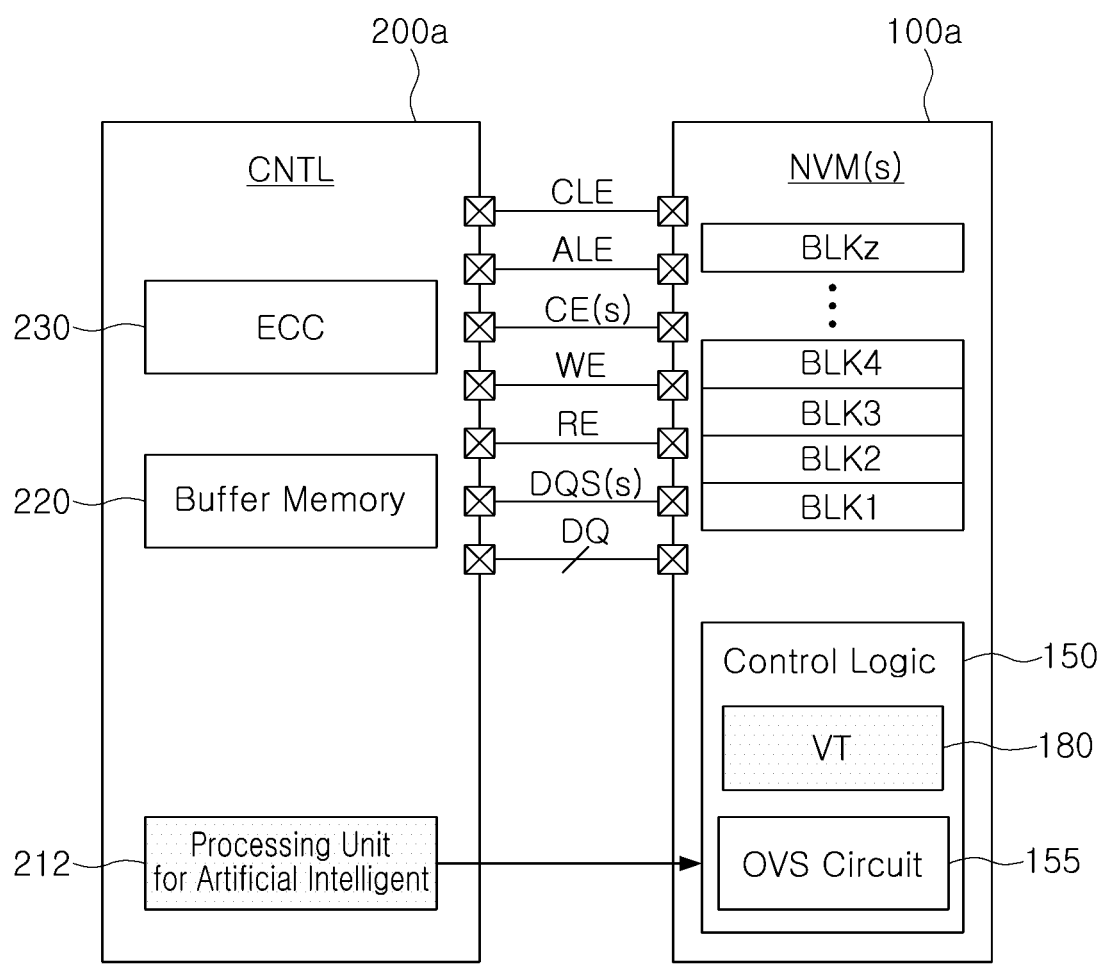
FIG. 21 is a schematic block diagram illustrating a storage device according to an example embodiment.

FIG. 21 is a block diagram simply illustrating a storage device according to an example embodiment.

Referring to FIG. 21, a storage device 20 according to an example embodiment may include an artificial intelligence processor 212 that controls the OVS defense code, as compared with that illustrated in FIG. 1. The artificial intelligence processor 212 may use a machine learning-based calculation algorithm to manage the reliability of a nonvolatile memory device 100a. For example, the artificial intelligence processor 212 may be used to determine the degree of deterioration of a threshold voltage by an OVS circuit 155 included in the nonvolatile memory device 100a.

However, the location of the artificial intelligence processor 212 is not necessarily limited to that illustrated in FIG. 21. Also, the artificial intelligence processor 212 may also be used in a memory controller 200a to determine the degree of deterioration of the threshold voltage, using the offset information of the history reading level table HRT.

Figure 22:
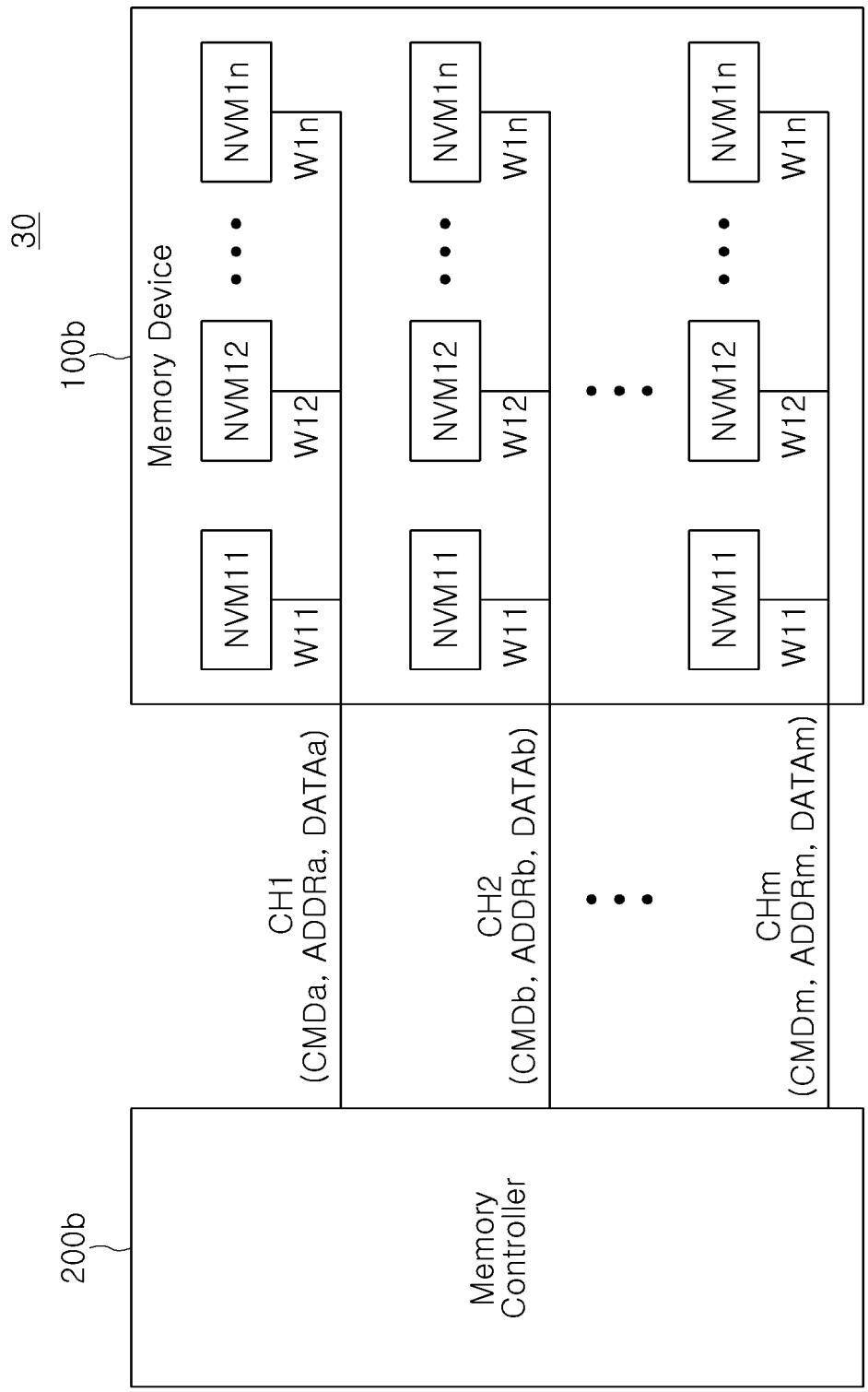
FIG. 22 is a block diagram illustrating a memory system including a storage device according to an example embodiment.

FIG. 22 is a block diagram illustrating a memory system including a storage device according to an example embodiment.

Referring to FIG. 22, a memory system 30 may include a memory device 100b and a memory controller 200b. The memory system 30 may support a plurality of channels CH1 to CHm, and the memory device 100b and the memory controller 200b may be connected through the plurality of channels CH1 to CHm. For example, the memory system 30 may be implemented as a storage device such as a solid state drive (SSD). The memory system 30 may be implemented to proceed with the OVS defense code as described in FIGS. 1 to 21.

The memory device 100b may include a plurality of nonvolatile memory devices NVM11 to NVMmn. Each of the nonvolatile memory devices NVM11 to NVMmn may be connected to one of the plurality of channels CH1 to CHm through a corresponding way. For example, the nonvolatile memory devices NVM11 to NVM1n may be connected to a first channel CH1 through ways W11 to W1n, and nonvolatile memory devices NVM21 to NVM2n may be connected to a second channel CH2 through ways W21 to Wln to W2n. In an example embodiment, each of the nonvolatile memory devices NVM11 to NVMmn may be implemented as an arbitrary memory unit capable of operating according to an individual command from the memory controller 200b. For example, each of the nonvolatile memory devices NVM11 to NVMmn may be implemented as a chip or a die, but embodiments are not limited thereto.

The memory controller 200b may transmit/receive signals to and from the memory device 100b through the plurality of channels CH1 to CHm. For example, the memory controller 200b may transmit commands CMDa to CMDm, addresses ADDRa to ADDRm, and data DATAa to DATAm to the memory device 100b through the channels CH1 to CHm, or may receive data DATAa to DATAm from the memory device 100b therethrough.

The memory controller 200b may select one of the nonvolatile memory devices connected to the corresponding channel through each channel, and may transmit/receive signals to/from the selected nonvolatile memory device. For example, the memory controller 200b may select the nonvolatile memory device NVM11 from among the nonvolatile memory devices NVM11 to NVM1n connected to the first channel CH1. The memory controller 200b may transmit the command CMDa, the address ADDRa, and the data DATAa to the selected nonvolatile memory device NVM11 through the first channel CH1 or may receive data DATAa from the selected nonvolatile memory device NVM11.

The memory controller 200b may transmit/receive signals to and from the memory device 100b in parallel through different channels. For example, the memory controller 200b may transmit the command CMDb to the memory device 100b through the second channel CH2 while transmitting the command CMDa to the memory device 100b through the first channel CH1. For example, the memory controller 200b may receive data DATAb from the memory device 100b through the second channel CH2 while receiving data DATAa from the memory device 100b through the first channel CH1.

The memory controller 200b may control the overall operation of the memory device 100b. The memory controller 200b may transmit signals to the channels CH1 to CHm to control each of the nonvolatile memory devices NVM11 to NVMmn connected to the channels CH1 to CHm. For example, the memory controller 200b may transmit the command CMDa and the address ADDRa to the first channel CH1 to control a selected one of the nonvolatile memory devices NVM11 to NVM1n.

Each of the nonvolatile memory devices NVM11 to NVMmn may operate under the control of the memory controller 200b. For example, the nonvolatile memory device NVM11 may program the data DATAa according to the command CMDa, the address ADDRa, and the data DATAa provided to the first channel CH1. For example, the nonvolatile memory device NVM21 may read the data DATAb according to the command CMDb and the address ADDRb provided to the second channel CH2, and may transmit the read data DATAb to the memory controller 200b.

FIG. 22 illustrates that the memory device 100b communicates with the memory controller 200b through m channels, and the memory device 100b includes n nonvolatile memory devices corresponding to channels respectively. However, the number of channels and the number of nonvolatile memory devices connected to one channel may be variously changed.

Figure 23:
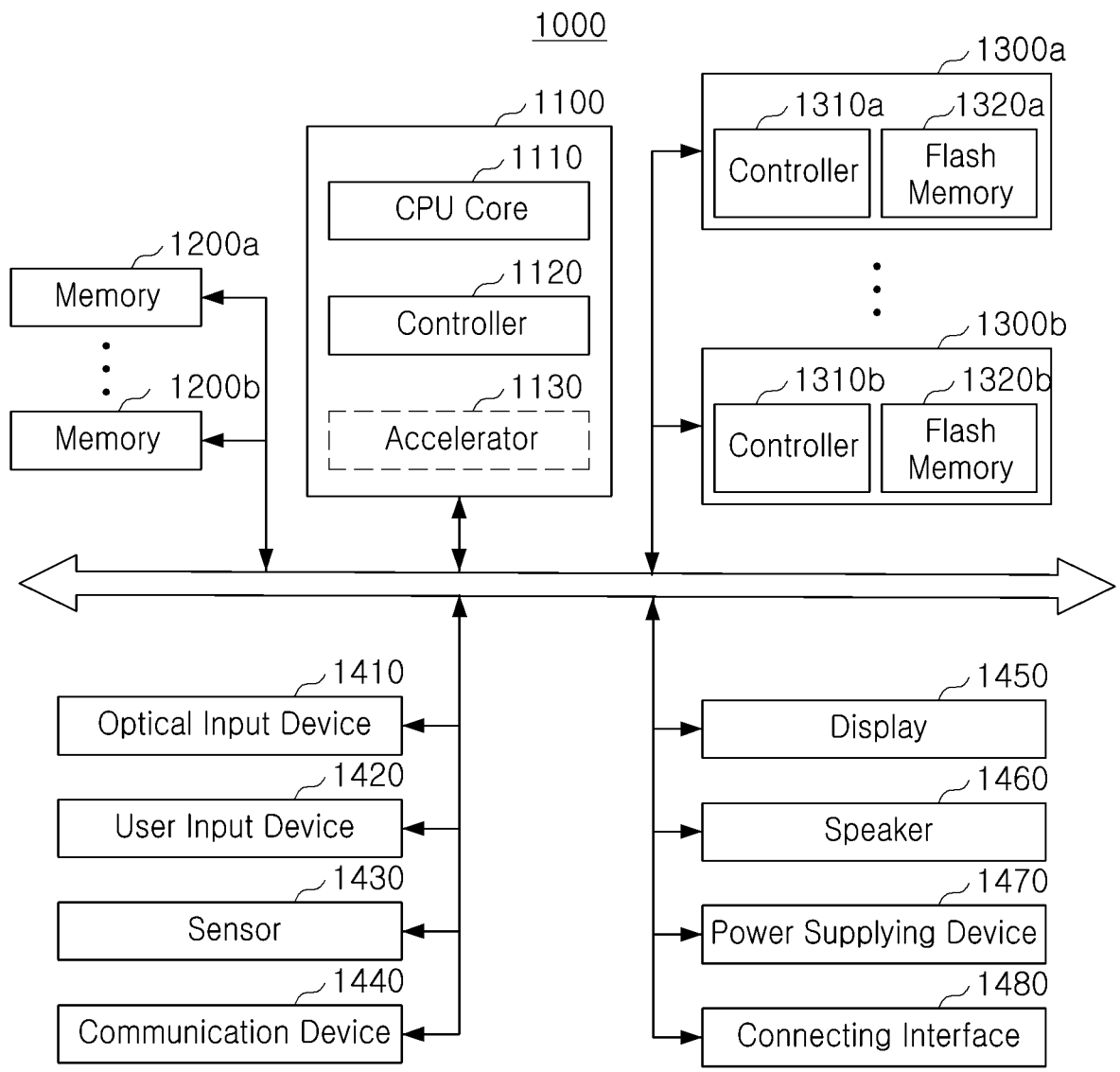
FIG. 23 is a diagram illustrating an electronic device including a storage device according to an example embodiment.

FIG. 23 is a diagram illustrating an electronic device including a storage device according to an example embodiment.

An electronic device 1000 of FIG. 23 may basically be a mobile system, such as a portable communication terminal (e.g., a mobile phone), a smartphone, a tablet personal computer (PC), a wearable device, a healthcare device, or an Internet of things (JOT) device. However, the electronic device 1000 of FIG. 23 is not necessarily limited to the mobile system, and may be a personal computer (PC), a laptop computer, a server, a media player, an automotive device such as a navigation device, or the like.

Referring to FIG. 23, the electronic device 1000 may include a main processor 1100, memories (e.g., 1200a and 1200b), and storage devices (e.g., 1300a and 1300b). In addition, the electronic device 1000 may include at least one of an image capturing device 1410, a user input device 1420, a sensor 1430, a communication device 1440, a display 1450, a speaker 1460, a power supplying device 1470, and a connecting interface 1480.

The main processor 1100 may control all operations of the electronic device 1000, in more detail, operations of other components included in the electronic device 1000. The main processor 1100 may be implemented as a general-purpose processor, a dedicated processor, or an application processor.

The main processor 1100 may include at least one CPU core 1110 and further include a controller 1120 configured to control the memories 1200a and 1200b and/or the storage devices 1300a and 1300b. In some embodiments, the main processor 1100 may further include an accelerator block 1130, which is a dedicated circuit for a high-speed data operation, such as an artificial intelligence (AI) data operation. The accelerator block 1130 may include a graphics processing unit (GPU), a neural processing unit (NPU) and/or a data processing unit (DPU) and be implemented as a chip that is physically separate from the other components of the main processor 1100.

The memories 1200a and 1200b may be used as main memory devices of the electronic device 1000. Although each of the memories 1200a and 1200b may include a volatile memory, such as static random access memory (SRAM) and/or dynamic RAM (DRAM), each of the memories 1200a and 1200b may include non-volatile memory, such as a flash memory, phase-change RAM (PRAM) and/or resistive RAM (RRAM). The memories 1200a and 1200b may be implemented in the same package as the main processor 1100.

The storage devices 1300a and 1300b may serve as non-volatile storage devices configured to store data regardless of whether power is supplied thereto, and have larger storage capacity than the memories 1200a and 1200b. The storage devices 1300a and 1300b may respectively include storage memory controllers 1310a and 1310b, and NonVolatile Memories (NVMs) 1320a and 1320b storing data under the control of the storage memory controllers 1310a and 1310b. Although the NVMs 1320a and 1320b may include V-NAND flash memories having a two-dimensional (2D) structure or a three-dimensional (3D) structure, the NVMs 1320a and 1320b may include other types of NVMs, such as PRAM and/or RRAM.

The storage devices 1300*a* and 1300*b* may be physically separated from the main processor 1100 and included in the electronic device 1000 or implemented in the same package as the main processor 1100. In addition, the storage devices 1300*a* and 1300*b* may have types of solid-state devices (SSDs) or memory cards and be removably combined with other components of the electronic device 1000 through an interface, such as the connecting interface 1480 that will be described below. The storage devices 1300*a* and 1300*b* may be devices to which a standard protocol, such as a universal flash storage (UFS), an embedded multi-media card (eMMC), or a non-volatile memory express (NVMe), is applied, without being limited thereto.

The image capturing device 1410 may capture still images or moving images. The image capturing device 1410 may include a camera, a camcorder, and/or a webcam.

The user input device 1420 may receive various types of data input by a user of the electronic device 1000 and include a touch pad, a keypad, a keyboard, a mouse, and/or a microphone.

The sensor 1430 may detect various types of physical quantities, which may be obtained from the outside of the electronic device 1000, and convert the detected physical quantities into electric signals. The sensor 1430 may include a temperature sensor, a pressure sensor, an illuminance sensor, a position sensor, an acceleration sensor, a biosensor, and/or a gyroscope sensor.

The communication device 1440 may transmit and receive signals between other devices outside the electronic device 1000 according to various communication protocols. The communication device 1440 may be implemented to include an antenna, a transceiver, and/or a modem.

The display 1450 and the speaker 1460 may serve as output devices configured to respectively output visual information and auditory information to the user of the electronic device 1000.

The power supplying device 1470 may appropriately convert power supplied from a battery embedded in the electronic device 1000 and/or an external power source, and supply the converted power to each of components of the electronic device 1000.

The connecting interface 1480 may provide connection between the electronic device 1000 and an external device, which is connected to the electronic device 1000 and capable of transmitting and receiving data to and from the electronic device 1000. The connecting interface 1480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

As set forth above, a nonvolatile memory device according to an example embodiment may include a variation table including variation information according to deterioration of a word line threshold voltage. On the other hand, the nonvolatile memory device may internally set the variation information based on an X/Y cell count according to an on-chip valley search (OVS) operation. Accordingly, correction accuracy for deterioration of the word line threshold voltage may be improved, and a memory usage of a memory controller may be reduced.

While example embodiments have been illustrated and described above, it will be apparent to those skilled in the art that modifications and variations could be made without departing from the scope of the present disclosure as defined by the appended claims.

What is claimed is:

1. A nonvolatile memory device comprising:
   a memory block including a first memory area connected to a first word line; and
   control logic comprising:
      an on-chip valley search (OVS) circuit configured to perform an OVS sensing operation on the memory block; and
      a first buffer memory configured to store at least one variation table including variation information of a threshold voltage of memory cells connected to the first word line, obtained from the OVS sensing operation,
   wherein the control logic is configured to:
      perform a first reading operation on the first memory area in response to a first read command applied by a memory controller, the first reading operation including a first OVS sensing operation performed at a first OVS sensing level and a first main sensing operation performed at a first main sensing level reflecting the variation information in response to the first read command.

2. The nonvolatile memory device of claim 1, wherein the control logic is further configured to determine a weight reflecting the variation information included in the at least one variation table according to a detection case according to the first OVS sensing operation.

3. The nonvolatile memory device of claim 2, wherein a first weight reflecting the variation information provided when the detection case is an edge case is higher than a second weight reflecting the variation information provided when the detection case is not the edge case.

4. The nonvolatile memory device of claim 1, wherein the control logic further comprises a selection logic configured to select at least one of the at least one variation table, based on a result of the first OVS sensing operation.

5. The nonvolatile memory device of claim 4, wherein the selection logic is further configured to select one of the at least one variation table according to a detection case according to the first OVS sensing operation, and
   the first main sensing level at which the first main sensing operation is performed is a reading level in which the variation information included in the at least one variation table selected is reflected.

6. The nonvolatile memory device of claim 1, wherein the control logic is further configured to selectively update the at least one variation table based on a result of the first OVS sensing operation.

7. The nonvolatile memory device of claim 1, wherein the memory block further includes a second memory area connected to a second word line, and
   the control logic is further configured to, after the first reading operation on the first memory area is completed, input to the second memory area a second read command determined based on a history reading level table stored in the memory controller.

8. The nonvolatile memory device of claim 7, wherein the at least one variation table further includes variation information of threshold voltages of memory cells connected to the second word line, and
   the control logic is further configured to perform a second reading operation at a reading level in which the variation information is reflected.

9. The nonvolatile memory device of claim 1, wherein the first OVS sensing level at which the first OVS sensing operation is to be performed has a value different from the first main sensing level.

10. The nonvolatile memory device of claim 9, wherein the first OVS sensing level is a default reading level.

11. A memory controller comprising:
a processor;
control pins configured to provide control signals to at least one nonvolatile memory device including a first memory area connected to a first word line;
an error correction circuit configured to correct data read from the at least one nonvolatile memory device based on the control signals; and
a buffer memory configured to store a plurality of tables for compensating for a reading level of a reading operation of the at least one nonvolatile memory device,
wherein the processor is configured to input a first read command for performing a first reading operation on the first memory area using at least one variation table stored in the at least one nonvolatile memory device,
wherein the plurality of tables includes a history reading level table, and the processor is further configured to update the history reading level table when error correction of data read by the first reading operation is successful,
wherein the at least one nonvolatile memory device further includes a second memory area connected to a second word line; and the processor is further configured to input a second read command for performing a second reading operation on the second memory area to the at least one nonvolatile memory device, based on the history reading level table,
wherein the processor is further configured to input a variation flag together with the second read command to the at least one nonvolatile memory device, and
wherein the variation flag includes a signal allowing the at least one nonvolatile memory device to perform the second reading operation by reflecting variation information of threshold voltages of memory cells connected to the second word line, wherein the at least one variation table includes the variation information.

12. The memory controller of claim 11, further comprising a command selector configured to select a read command based on the history reading level table, the read command to be input to a nonvolatile memory device,
wherein the read command is configured to adjust information of the at least one variation table used in the first reading operation of the nonvolatile memory device.

13. A reading method of a storage device, the reading method comprising:
performing, in at least one nonvolatile memory device, a first on-chip valley search (OVS) sensing operation on selected memory cells in response to a first read command received from a memory controller;
extracting variation information of threshold voltages of the selected memory cells and deterioration information of a memory block including the selected memory cells;
performing a first main sensing operation at a modified reading level based on the variation information and the deterioration information; and
outputting a result of the first OVS sensing operation and data of the first main sensing operation to the memory controller,
wherein the first OVS sensing operation and the first main sensing operation are defined as a first reading operation.

14. The reading method of the storage device of claim 13, wherein the variation information is included in at least one variation table stored in the at least one nonvolatile memory device.

15. The reading method of the storage device of claim 13, further comprising performing a second reading operation on other selected memory cells by receiving a second read command after terminating the first reading operation, and outputting second read data.

16. The reading method of the storage device of claim 15, wherein the second read command is output together with a variation flag, and
wherein the variation flag includes a signal for performing the second reading operation using variation information of threshold voltages of the other selected memory cells included in the at least one nonvolatile memory device.

17. The reading method of the storage device of claim 13, further comprising updating a history reading level table based on the deterioration information, after the first reading operation is terminated.

* * * * *